US 6,876,210 B2

(12) United States Patent
Shimazaki et al.

(10) Patent No.: US 6,876,210 B2
(45) Date of Patent: Apr. 5, 2005

(54) METHOD AND APPARATUS FOR ANALYZING ELECTROMAGNETIC INTERFERENCE

(75) Inventors: Kenji Shimazaki, Hyogo (JP); Shouzou Hirano, Osaka (JP); Tatsuo Ohhashi, Shiga (JP); Takashi Mizokawa, Kyoto (JP); Hiroyuki Tsujikawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/993,595

(22) Filed: Nov. 27, 2001

(65) Prior Publication Data

US 2002/0075018 A1 Jun. 20, 2002

(30) Foreign Application Priority Data

Nov. 27, 2000 (JP) .................................... P2000-359630

(51) Int. Cl.[7] ............................................. G01R 31/302
(52) U.S. Cl. ..................................................... 324/750
(58) Field of Search ................................ 324/765, 750, 324/117 R, 117 H, 763, 769

(56) References Cited

U.S. PATENT DOCUMENTS

| | | | |
|---|---|---|---|
| 5,294,826 A | 3/1994 | Marcantonio et al. | |
| 5,389,902 A | 2/1995 | Kameya | |
| 5,481,484 A | 1/1996 | Ogawa et al. | |
| 5,528,756 A | 6/1996 | Molnar | |
| 5,550,750 A | 8/1996 | Wolff | |
| 5,570,034 A * | 10/1996 | Needham et al. | 324/763 |
| 5,625,578 A | 4/1997 | Du Cloux et al. | |
| 5,650,935 A | 7/1997 | Nishino et al. | |
| 5,659,455 A | 8/1997 | Herbert | |
| 5,699,263 A | 12/1997 | Nakao | |
| 5,781,074 A | 7/1998 | Nguyen et al. | |
| 5,966,684 A | 10/1999 | Richardson et al. | |
| 5,969,390 A | 10/1999 | Kranzen | |
| 6,044,294 A | 3/2000 | Mortazavi et al. | |
| 6,106,567 A | 8/2000 | Grobman et al. | |
| 6,185,454 B1 | 2/2001 | Thompson | |
| 6,185,460 B1 | 2/2001 | Thompson | |
| 6,201,403 B1 | 3/2001 | Rollin et al. | |
| 6,219,629 B1 | 4/2001 | Namiki | |
| 6,237,126 B1 | 5/2001 | Bonitz | |
| 6,281,697 B1 * | 8/2001 | Masuda et al. | 324/765 |

FOREIGN PATENT DOCUMENTS

| | | |
|---|---|---|
| JP | 11-196190 | 7/1999 |
| JP | 11-200847 | 7/1999 |
| JP | 2000-63783 | 9/2001 |

OTHER PUBLICATIONS

"EMI–Noise Analysis under ASIC Design Environment", Sachio Hayashi et al., ISPD 1999, Monterey, California, pp. 16–23.

* cited by examiner

Primary Examiner—Evan Pert
Assistant Examiner—Tung X. Nguyen
(74) Attorney, Agent, or Firm—McDermott Will & Emery LLP

(57) ABSTRACT

A method of analyzing electromagnetic interference in which an amount of electromagnetic interference from an LSI is analyzed, wherein the method includes: an equivalent power source current information calculating step of calculating information of an equivalent power source current flowing in a power source current, from circuit information of the LSI chip; an estimating step of considering at least one of power source information of a power source for supplying a current to the LSI chip, package information of a package for the semiconductor chip, and measurement system information of a measurement system for measuring characteristics of the semiconductor chip, as analysis control information, and of estimating total information in which the analysis control information is reflected in the circuit information, as an equivalent circuit; and a total information analyzing step of performing analysis in accordance with the total information which is estimated in the estimating step.

28 Claims, 28 Drawing Sheets

LOGICAL CHANGE

ESTIMATED POWER SOURCE
CURRENT AT SMALL
DECOUPLING CAPACITANCE

ESTIMATED POWER SOURCE
CURRENT AT LARGE
DECOUPLING CAPACITANCE

LOGICAL CHANGE

ESTIMATED POWER SOURCE
CURRENT AT SMALL
DECOUPLING CAPACITANCE

ESTIMATED POWER SOURCE
CURRENT AT LARGE
DECOUPLING CAPACITANCE

| TIMING [ ns ] | POWER SOURCE CURRENT VALUE [ mA ] |
|---|---|
| 0 | 0 |
| 95 | 20 |
| 100 | 50 |
| 105 | 20 |
| 195 | 30 |
| 200 | 70 |
| 205 | 30 |
| 295 | 20 |
| 300 | 50 |
| 305 | 20 |
| 395 | 30 |
| 400 | 70 |
| 405 | 30 |
| 495 | 20 |
| 500 | 30 |
| 505 | 20 |

801  802

METHOD AND APPARATUS FOR ANALYZING ELECTROMAGNETIC INTERFERENCE

BACKGROUND OF THE INVENTION

1. Field of the Invention

The present invention relates to a method of analyzing electromagnetic interference (EMI) and an apparatus for analyzing electromagnetic interference, and more particularly to a method of performing high-speed and accurate EMI analysis on a large and high-speed driven LSI (Large Scale Integrated circuit) to analyze electromagnetic interference.

2. Description of the Related Art

The range in which an LSI is useful is expanding not only to a computer, but also to a communication device such as a portable telephone, usual housewares, a tool, and an automobile. On the other hand, there is a problem in that electromagnetic interference produced in such a product causes radio wave interference in a receiving device such as a television receiver and a radio set, or a malfunction of another system. In order to solve the problem, a countermeasure such as provisions of a filtering device or a shielding device is taken for the whole of a product. However, such a countermeasure increases the number of parts and the production cost, and is difficult to be taken on a product. From the viewpoints of these disadvantages and the like, it is strongly requested to apply noise suppression on an LSI package itself.

Under these circumstances, an LSI is positioned at a key device of each product, and is requested to be increased in scale and speed in order to ensure the competitiveness of the product. In view of a shortened product cycle, it is necessary to automatically design an LSI, and the need for employing synchronous design as conditions for introducing a current design automating technique is growing. In the case of a large and high-speed driven LSI in which all circuits operate in synchronization with a reference clock, an instantaneous current of a very high level flows to cause increased electromagnetic interference.

The invention relates to a method of analyzing EMI in which EMI evaluation that is essential to reduce electromagnetic interference is enabled while maintaining the large scale and the high-speed operation of an LSI.

Noise which is generated by an LSI to damage other systems is roughly classified into radiative noise and conductive noise. Radiative noise which is generated directly from an LSI includes noise which is radiated from internal lines of the LSI. However, internal lines do not constitute a large antenna. Since the operating frequency of an LSI is expected to be raised, noise which is radiated directly from an LSI may cause a problem in the future. At present, however, the level of radiative noise from the inside of an LSI is not so high to cause a problem.

By contrast, conductive noise affects other devices on a printed circuit board through direct connecting means such as wires in an LSI, a lead frame, a package, and lines on the printed circuit board, and noise is radiated by using the connection paths as an emission source, i.e., an antenna. This antenna configured by the connection paths is very larger than lines in the LSI, and functions as a dominant factor from the viewpoint of electromagnetic interference.

With respect to conductive noise from an LSI, a power source and a signal function as paths. In a surrounding electromagnetic field, however, noise which is caused by changes of a current of a power source and radiated by using power source lines as an antenna seems to be dominant.

In a signal, ringing and overshoot which are generated at a change of the signal may cause a problem. However, it is often that a phenomenon that variation of the power source level in an LSI is transmitted as a current waveform becomes a problem. It seems that also noise which is transmitted through either of the power source path or a signal path and then radiated closely correlates with a change of the power source current.

In addition to the power source, furthermore, also a package often becomes a problem.

Recently, EMI noise in an LSI is seriously problematic. Therefore, IEC (International Electrotechnical Commission) intends to standardize a method of measuring EMI noise in an LSI, and analyzing methods such as the magnetic probe method and the VDE method have been proposed.

When a measuring method is standardized, LSI vendors can stay on the equal footing to push EMI noise performances of their respective LSIs to the customers. The customers can perform absolute comparison from the viewpoint of EMI noise, on LSIs. It seems that, when such a standard measuring method is widely used, an EMI noise standard for an LSI will be naturally established.

Conventionally, a measurement system (a measuring apparatus and a printed circuit board which is used in measurement) is not considered. In a phase of developing an LSI, therefore, it is impossible to judge whether the standard is satisfied or not.

The power source current of a CMOS circuit will be described by using a simple inverter circuit. When an input voltage of an inverter circuit is changed, load capacitance charging and discharging currents which mainly constitute the power source current of the CMOS circuit flows. Furthermore, a through current additionally flows. In a design of such a CMOS circuit, synchronization is conducted because of constraints of using an automatic design tool. Because of the synchronization, circuits of the whole LSI simultaneously operate, and hence a peak current is generated in the power source in synchronization with a reference clock. In order to increase the speed or to shorten the period, transistors are designed so as to be large, thereby enabling charging and discharging operations to be conducted in a short time period. As a result, the peak current is increased. Of course, the power source current of the whole LSI is increased also by enlarging the LSI. In this way, the peak current of the power source is increased, and the power source current is steeply changed. This steep change increases harmonic components, thereby causing electromagnetic interference to be enhanced.

An accurate simulation of a change of the power source current which would be the principal factor of electromagnetic interference seems to be effective in evaluation of electromagnetic interference in an LSI.

Conventionally, a current simulation technique in which a current analysis is conducted at the transistor level as described below is used.

FIG. 46 is a chart showing a process flow of a conventional EMI analyzing method which uses a current simulation technique at the transistor level. This method is configured so that a layout parameter extraction (hereinafter, abbreviated to LPE) process is performed on the basis of layout information of an LSI which is to be analyzed, and steps of a circuit simulation, a current source modeling process, a power source line LPE process, a transient analysis simulation, and an FFT process are performed on a switch level netlist.

Hereinafter, the steps will be described with reference to FIG. 46. In step 4603, layout data 4601 of a semiconductor integrated circuit on which EMI analysis is to be performed, and an LPE rule 4602 in which transistor elements and various parasitic line elements (resistors, capacitors, and the like), parameter values of the elements, and output formats of extraction results are defined are input. Based on the LPE rule 4602, parameters of the elements in the layout data 4601 are calculated to generate a netlist 4604. In this step, parasitic elements of the power source (and ground) lines are not set as extraction objects.

In step 4606, the netlist 4604 which is generated in previous step 4603, and a test pattern 4605 for reproducing a desired logical operation in a circuit to be analyzed are input. In accordance with the operation states of internal circuits, load capacitance charging and discharging currents, a through current, and the like are calculated to generate current waveform information 4607 for each transistor. In the initial process of this step, it is assumed that the power source (and ground) potential is an ideal potential which is free of variation.

In step 4608, the current waveform information 4607 for each transistor which is generated in previous step 4606 is input, and each of the information is modeled into a form which is applicable in subsequent step 4612, thereby producing current source element model information 4609. Usually, a technique of modeling each functional circuit block configured by plural transistors as a current source element is employed in order also to reduce the processing load of subsequent step 4612.

Step 4610 is identical with step 4603 except that the extraction objects are parasitic elements (resistors, decoupling capacitors, and the like) of the power source and ground lines in place of transistor elements and various parasitic line elements on which EMI analysis is to be performed. Therefore, description of the step is omitted. In this step, a power source (and ground) line netlist 4611 is generated.

In step 4612, the current source element model information 4609 which is generated in previous step 4608, the power source (and ground) line netlist 4611 which is generated in previous step 4610, and an impedance (resistance, capacitance, and inductance) 4616 of wires and a lead frame are input. A power source voltage drop result 4617 in which power source voltage variation of the circuit to be analyzed is calculated is generated by analysis using a transient analysis simulator which is typified by SPICE.

Thereafter, the process of step 4606 is again performed. In this case, by contrast to the initial process of step 4606 in which it is assumed that the power source (and ground) potential is an ideal potential which is free of variation, the power source voltage drop result 4617 which is generated in previous step 4612 is input, and the current waveform information 4607 for each transistor in which the power source voltage variation is considered is again generated. Similarly, steps 4608 and 4612 are again performed.

When the loop process of steps 4606, 4608, and 4612 is repeated plural times, a current waveform result 4613 in which the power source voltage variation is accurately reproduced is generated. In step 4614, the current waveform result 4613 which is generated in previous step 4612 is input, and fast Fourier transform (hereinafter, abbreviated to FFT) is applied, thereby enabling frequency spectrum analysis to be performed. Then, it is possible to obtain an EMI analysis result 4615.

In the conventional art example, it is expected to attain an analysis accuracy of a certain level although the verification accuracy largely depends on matching of the LPE process 4603, the power source line LPE process 4610, and the current source modeling process 4608. In such current analysis at the transistor level, however, a transient analysis simulator which is typified by SPICE is used. Therefore, the scale of a circuit on which EMI analysis is to be performed is limited and the process time period is prolonged. Recently, the scale of a semiconductor integrated circuit is being enlarged, and hence it is requested to establish an EMI analyzing method in which the degree of abstraction is higher than the transistor level and analysis can be rapidly performed.

As an EMI current analyzing method the speed of which can be increased, EMI current analyzing methods at the gate level have been proposed. An example of such methods is EMI-noise analysis under an ASIC design environment which is described in pp. 16 to 21 of ISPD & 99 (EMI-NOISE ANALYSIS UNDER ASIC DESIGNS ENVIRONMENT' ISPD & 99). In this technique, an event is obtained from a result of a gate-level simulation using test vectors, a current waveform is inferred, and frequency analysis is performed by FFT. Specifically, as shown in FIG. 47, a logical simulation 4703 is performed on the basis of Verilog Netlist 4701 and test vectors 4702, and a waveform inferring step 4705 is performed on the basis of event data 4704 calculated in the simulation, and waveform information 4706 at a toggling operation. An FFT process is performed on an inferred current waveform 4707 which is obtained in the waveform inferring step, to obtain frequency characteristics. In this method, the speed can be increased as compared with conventional EMI analysis at the transistor level.

In a logical simulation, usually, the power source and the ground are deemed as an ideal potential which is free of variation, and hence an influence of decoupling due to the resistance, the capacitance, and the inductance of the power source and the ground cannot be reflected in the power source current calculation. When the influence of decoupling is to considered, it is required to apply transient analysis on current values of elements which are obtained from the network of the power source and the ground including parasitic element such as the resistance, the capacitance, and the inductance, and a logical simulation. Therefore, the time period required for the process is extremely prolonged.

Because of tendency of increasing the chip scale and the number of elements, the scale of a network of power source lines is being increased, and such a prolonged process time period constitutes a serious obstacle to analysis of electromagnetic interference. In order to shorten the process time period, reduction means for the resistance and the capacitance of such power source lines has bee proposed. However, this countermeasure is restricted to a gate array in which power source lines are arranged in a lattice structure.

Even when EMI analysis is performed by applying FFT to power source current values, the designer oneself must judge FFT characteristics. According to this means, it requires a very long time period or is impossible to identify a causing place. The means has a further problem in that analysis information is insufficient for being directly reflected in correction.

Since also a package and a measurement system contain an inductance, the process time period is prolonged, thereby causing a problem which cannot be neglected in analysis of electromagnetic interference.

As described above, the conventional methods of analyzing electromagnetic interference in an LSI are not sufficient from the viewpoints that consideration of the resistance, the capacitance, and the inductance of the power source and the ground, and also the measurement system is compatible with high-speed processing, and that a result of analysis of electromagnetic interference is rapidly reflected in the design.

As described above, in the conventional art examples using a current analyzing technique at the transistor level, it is expected to attain an analysis accuracy of a certain level. However, a transient analysis simulator which is typified by SPICE is used in such current analysis at the transistor level. Therefore, the scale of a circuit to be analyzed is limited and the process time period is prolonged. Recently, the scale of a semiconductor integrated circuit is being enlarged, and hence it is requested to establish an EMI analyzing method using a current analyzing technique at the gate level in which the degree of abstraction is higher than the transistor level and analysis can be rapidly performed.

On the other hand, also a current analyzing technique at the gate level has been proposed. However, this technique has problems in that, when the power source and the ground, and also the measurement system are handled at an ideal potential which is free of variation, the decoupling effect cannot be considered, and that, when transient analysis is applied on the network of the power source and the ground including parasitic elements in order to consider decoupling, the analysis time period is prolonged.

Conventionally, the problems of a measurement system including such a measuring apparatus and a printed circuit board which is used in measurement are not considered. Consequently, there arises a problem in that, in a phase of developing an LSI, it is impossible to judge whether the above-mentioned standard is satisfied or not.

Even when EMI analysis is performed, a circuit in which the main cause exists cannot be known, thereby causing a further problem in that it is impossible to know which circuit is to be corrected in order to improve EMI.

In order to provide a method and an apparatus for analyzing electromagnetic interference in which, while high-speed analysis is performed, an influence of decoupling due to the resistance, the capacitance, and the inductance of the power source and the ground is reflected in a power source current calculation, whereby electromagnetic interference of an LSI can be evaluated in a simulation within a realistic time period, the inventors have proposed a method of analyzing electromagnetic interference which includes steps of; allocating a discrete width of FFT analysis for each frequency band and performing a modeling process; and applying a fast Fourier transform process on current change information which is calculated by the modeling step (Japanese patent application No. 2000-63783).

Also a method has been proposed in which an inferred current waveform of each logical change in a digital simulation is set to a triangular wave the base of which is expressed by a function of a transition time, thereby enabling high-speed processing (Japanese patent application No. 11-196190).

In this method, an influence of the decoupling capacitance on an FFT result cannot be expressed, and, in order to express the influence, the base of the triangle must be widened. When the base is widened, however, such an influence cannot be correctly expressed, thereby causing a problem in that the widening cannot attain an effect.

Furthermore, a mixed mode simulation method in which an analog portion is analyzed in synchronization with a digital simulation has been proposed (Japanese patent application No. 4-54215).

In the method, reflection to the analog portion is considered, but an influence on a power source netlist is not considered. Therefore, the method has a problem in that the accuracy is low from the viewpoint of EMI noise analysis.

Since a synchronization calculation is performed, a current must be calculated after a logical change of a digital portion although a current change due to the logical change is originally generated before the logical change. Therefore, the method has another problem in that it is impossible to correctly reflect the power source current.

As described above, also EMI which is caused by a package is as high as an unnegligible level. Consequently, the method has a further problem in that an obtained value is different from a measured value unless EMI due to a measurement system is considered in addition to circuit information of an LSI chip.

SUMMARY OF THE INVENTION

The invention has been conducted in view of the circumstances discussed above. It is an object of the invention to provide a method and an apparatus for analyzing electromagnetic interference in which, while high-speed analysis is performed, an influence of decoupling due to the resistance, the capacitance, and the inductance of the power source and the ground is reflected in a power source current calculation, whereby electromagnetic interference of an LSI can be evaluated in a simulation within a realistic time period.

According to a first aspect of the invention, in a method of analyzing an amount of electromagnetic interference from an LSI, the method includes:

an equivalent power source current information calculating step of calculating information of an equivalent power source current flowing in a power source current, from circuit information of the LSI chip;

an estimating step of considering at least one of power source information of a power source for supplying a current to the LSI chip, package information of a package for the semiconductor chip, and measurement system information of a measurement system for measuring characteristics of the semiconductor chip, as analysis control information, and of estimating total information in which the analysis control information is reflected in the circuit information, as an equivalent circuit; and a total information analyzing step of performing analysis in accordance with the total information which is estimated in the estimating step.

In the configuration, electromagnetic interference due to the power source and the package can be analyzed rapidly and accurately by using a small memory capacity, and the measurement system can be modeled, whereby the analyzed value can correlate with a result of measurement of an LSI using a measuring apparatus which will be standardized.

According to a second aspect of the invention, in the method of analyzing electromagnetic interference of the first aspect of the invention, the estimating step is a step of calculating a total impedance by adding the analysis control information to the circuit information, and of outputting the calculated total impedance as total information to the total information analyzing step.

According to a third aspect of the invention, in the method of analyzing electromagnetic interference of the first or second aspect of the invention, the analysis control information includes: the power source information of the power source for supplying a current to the LSI chip; and at least one of the package information of the package for the semiconductor chip, and the measurement system information of the measurement system for measuring characteristics of the semiconductor chip.

According to a fourth aspect of the invention, in the method of analyzing electromagnetic interference of the first or second aspect of the invention, the analysis control information includes: the power source information of the power source for supplying a current to the LSI chip; the package information of the package for the semiconductor chip; and the measurement system information of the measurement system for measuring characteristics of the semiconductor chip.

According to a fifth aspect of the invention, in the method of analyzing electromagnetic interference of any one of the first to fourth aspects of the invention, the total information analyzing step is a simulation step of performing a simulation by adding the equivalent power source current information to the total information.

According to a sixth aspect of the invention, in the method of analyzing electromagnetic interference of any one of the first to fifth aspects of the invention, the total information analyzing step includes: a step of obtaining corrected equivalent power source current information in which the equivalent power source current is corrected by reflecting the total information; and a frequency spectrum calculating step of calculating a frequency spectrum of the corrected equivalent power source current information.

According to a seventh aspect of the invention, in the method of analyzing electromagnetic interference of any one of the first to sixth aspects of the invention, the equivalent power source current information calculating step includes a frequency spectrum calculating step of calculating a frequency spectrum.

According to an eighth aspect of the invention, in the method of analyzing electromagnetic interference of any one of the first to fourth and seventh aspects of the invention, the total information analyzing step is a step of obtaining a correction function for correcting the equivalent power source current information, from the total information, and of calculating the equivalent power source current information by using the correction function.

According to a ninth aspect of the invention, in the method of analyzing electromagnetic interference of any one of the first to eighth aspects of the invention, the equivalent power source current information calculating step includes: a step of calculating an instantaneous current amount in consideration of: event information which is generated at occurrence of a change of a signal, and which includes instance names of cells of the LSI chip that is an object of the occurrence, a name of the signal, an occurrence time, and transition information; and the total information which is estimated in the estimating step; and a modeling step of modeling the instantaneous current amount in accordance with a predetermined rule.

According to a tenth aspect of the invention, in the method of analyzing electromagnetic interference of the ninth aspect of the invention, the modeling step is a step of accumulating current waveforms each having a Japanese chess piece-like shape.

According to an eleventh aspect of the invention, in the method of analyzing electromagnetic interference of the fifth aspect of the invention, the simulation step includes a step of synchronizing with the equivalent power source current information calculating step.

According to a twelfth aspect of the invention, in the method of analyzing electromagnetic interference of the fifth aspect of the invention, the simulation step includes a step of repeatedly performing a simulation in synchronization with a timing of adding information to the equivalent power source current information.

According to a thirteenth aspect of the invention, in the method of analyzing electromagnetic interference of the fifth aspect of the invention, the simulation step includes a step of reading the equivalent power source current information at predetermined intervals.

According to a fourteenth aspect of the invention, in the method of analyzing electromagnetic interference of the sixth aspect of the invention, the frequency spectrum calculating step includes a collapsing step of collapsing the corrected equivalent power source current information at predetermined intervals.

According to a fifteenth aspect of the invention, in the method of analyzing electromagnetic interference of the fourteenth aspect of the invention, in the collapsing step, sets of the corrected equivalent power source current information at predetermined intervals are averaged or maximized in time sequence.

According to a sixteenth aspect of the invention, in the method of analyzing electromagnetic interference of any one of the first to fifteenth aspects of the invention, the equivalent power source current information calculating step is a library accumulating step of calculating accumulation of library information which is equivalent power source current information of each portion of the current information that is previously calculated.

According to a seventeenth aspect of the invention, in the method of analyzing electromagnetic interference of the sixteenth aspect of the invention, the library information is a function or a table of one of input signal information and output signal information of each portion of the current information, and an output capacitance.

According to an eighteenth aspect of the invention, in the method of analyzing electromagnetic interference of the sixteenth aspect of the invention, the library information is information of a portion which is obtained by dividing the circuit information into one or more parts, i.e., a clock synchronous part which is synchronized with a clock, and a clock asynchronous part which is not synchronized with the clock.

According to a nineteenth aspect of the invention, in the method of analyzing electromagnetic interference of the eighteenth aspect of the invention, the clock synchronous part is a flip-flop, a clock buffer, or a synchronous memory.

According to a twentieth aspect of the invention, in the method of analyzing electromagnetic interference of the sixteenth aspect of the invention, the library accumulating step includes a step of, from the circuit information, analogizing which portion of the circuit information corresponds to a library.

According to a twenty-first aspect of the invention, in the method of analyzing electromagnetic interference of any one of the first to sixteenth aspects of the invention, the equivalent power source current information calculating step includes a calculation method determining step of selecting one of a high-speed equivalent power source current information calculating method and an accurate equivalent power source current information calculating method, based on partial circuit information of the circuit information.

According to a twenty-second aspect of the invention, in the method of analyzing electromagnetic interference of any one of the first to sixteenth and twenty-first aspects of the invention, the equivalent power source current information calculating step includes a differential power source current calculating step of, based on a difference of the circuit information with respect to equivalent power source current information which has been already analyzed, calculating power source current information of the difference only.

According to a twenty-third aspect of the invention, in the method of analyzing electromagnetic interference of any one of the first to sixteenth, twenty-first, and twenty-second aspects of the invention, the method further includes an analysis information displaying step of displaying a result obtained in the total information analyzing step, as analysis information.

According to a twenty-fourth aspect of the invention, in the method of analyzing electromagnetic interference of any one of the first to sixteenth and twenty-first to twenty-third aspects of the invention, the method further includes an optimizing step of optimizing the circuit information so as to reduce electromagnetic interference, based on a result obtained in the total information analyzing step.

According to a twenty-fifth aspect of the invention, in the method of analyzing electromagnetic interference of the twenty-fourth aspect of the invention, the method further includes an optimized information displaying step of displaying circuit information obtained in the optimizing step, as optimized information.

According to a twenty-sixth aspect of the invention, in an apparatus for analyzing electromagnetic interference in which an amount of electromagnetic interference from an LSI is analyzed, the apparatus includes: equivalent power source current information calculating means for calculating information of an equivalent power source current flowing in a power source current, from circuit information of the LSI chip; estimating means for considering at least one of power source information of a power source for supplying a current to the LSI chip, package information of a package for the semiconductor chip, and measurement system information of a measurement system for measuring characteristics of the semiconductor chip, as analysis control information, and for estimating total information in which the analysis control information is reflected in the circuit information, as an equivalent circuit; and total information analyzing means for performing analysis in accordance with the total information which is estimated in the estimating means.

According to a twenty-seventh aspect of the invention, in the apparatus for analyzing electromagnetic interference of the twenty-sixth aspect of the invention, the estimating means calculates a total impedance by adding the analysis control information to the circuit information, and outputs the calculated total impedance as total information to the total information analyzing means.

According to a twenty-eighth aspect of the invention, in the apparatus for analyzing electromagnetic interference of the twenty-sixth or twenty-seventh aspect of the invention, the total information analyzing means is simulation means for performing a simulation by adding the equivalent power source current information to the total information.

DESCRIPTION OF THE PREFERRED EMBODIMENTS

Hereinafter, embodiments of the method of analyzing electromagnetic interference according to the invention will be described.

Embodiment 1

Figure 1:
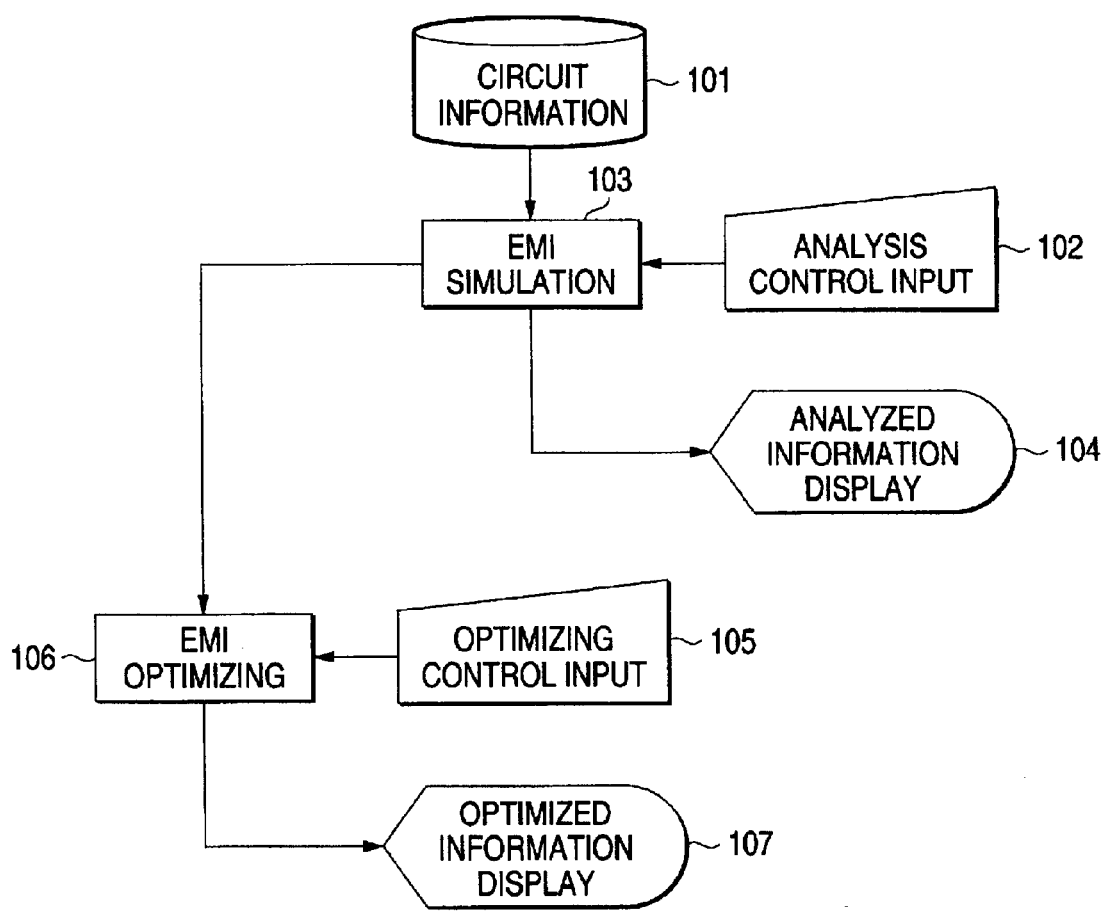
FIG. 1 is a block diagram showing a configuration for realizing a method of analyzing electromagnetic interference in a first embodiment of the invention.

FIG. 1 is a conceptual diagram showing the whole configuration of an apparatus for analyzing electromagnetic interference which performs the method of analyzing electromagnetic interference according to the invention.

The apparatus for analyzing electromagnetic interference is characterized in that, to circuit information 101 of an LSI chip, at least one of power source information of a power source for supplying a current to the LSI chip, package information of a package for a semiconductor chip, and measurement system information of a measurement system for measuring characteristics of the semiconductor chip is added as analysis control information, total information in which the analysis control information is added to the circuit information is roughly estimated, as an equivalent circuit, and a simulation in the information is considered is performed.

In the embodiment, the simulation is performed while, with respect to an inferred current waveform of each logical change in a digital simulation, the base is expressed by a function of a transition time, and the side faces are expressed by a function of a decoupling capacitance. Therefore, accurate electromagnetic interference analyzation of high reliability can be rapidly performed.

The apparatus for analyzing electromagnetic interference comprises: an analysis control input section 102 which adds to circuit information 101 of the LSI chip at least one of the power source information of the power source for supplying a current to the LSI chip, the package information of the package for the semiconductor chip, and the measurement system information of the measurement system for measuring characteristics of the semiconductor chip, as analysis control information, and estimates the total information in which the analysis control information is added to the circuit information, as an equivalent circuit; an electromagnetic interference simulation section 103 which performs a simulation in accordance with the total information estimated by the analysis control input section; an analysis information display section 104 which displays analysis information obtained by the electromagnetic interference simulation section 103; an electromagnetic interference optimization section 106 which optimizes electromagnetic interference on the basis of the analysis information obtained by the electromagnetic interference simulation section 103 and an optimization standard from an optimization control input section 105; and an optimized information display section 107 which displays optimized information on the basis of information of the electromagnetic interference optimization section 106.

Figure 2:
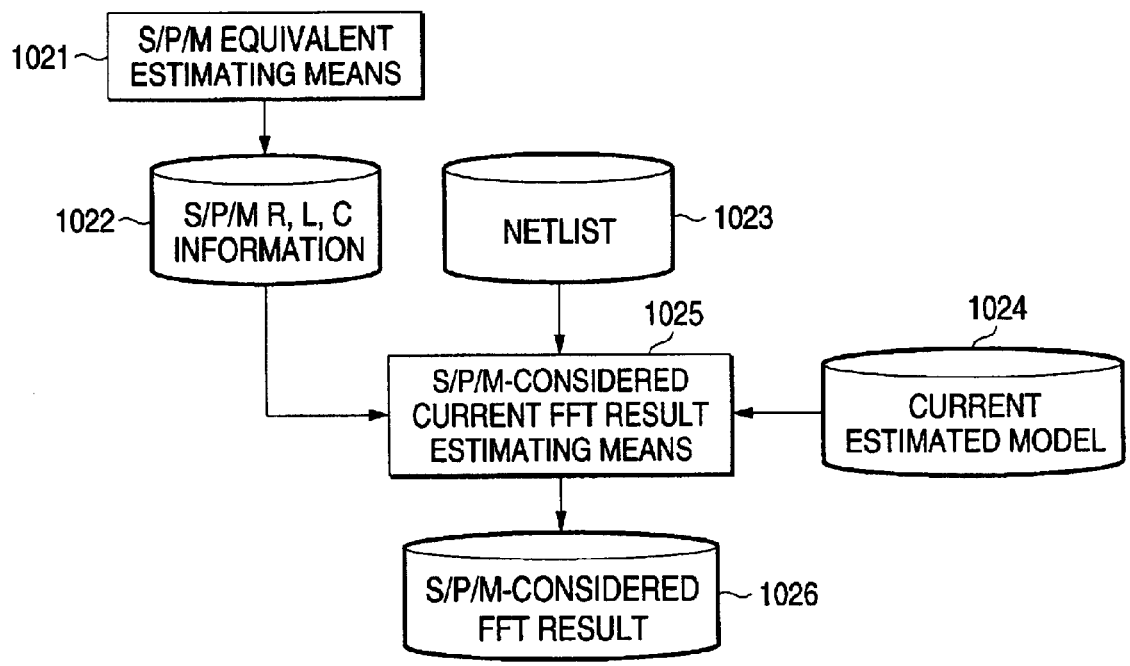
FIG. 2 is a flowchart for realizing the method of analyzing electromagnetic interference in the first embodiment of the invention.

As shown in FIG. 2, the analysis control input section 102 comprises equivalent circuit estimating means 1021 for adding at least one of the power source information of the power source for supplying a current to the LSI chip, the package information of the package for the semiconductor chip, and the measurement system information of the measurement system for measuring characteristics of the semiconductor chip, as analysis control information, and for estimating the total information in which the analysis control information is added to the circuit information, as an equivalent circuit. The equivalent circuit estimating means 1021 obtains power source/package/measurement system RLC information 1022, as equivalent circuit information of total information due to a power source/package/measurement system. The analysis control input section further comprises power source/package/measurement system considered current FFT result inferring means 1025 for calculating a power source current in which the power source/package/ measurement system is considered, from the power source/package/measurement system RLC information 1022, a netlist 1023 having circuit information, and a current inference model 1024, for performing an FFT process on the power source current, and for calculating a result of inference of a frequency spectrum of EMI noise due to the power source current. The analysis control input section outputs a power source/package/measurement system considered current FFT result 1026 which is a frequency spectrum obtained as an FFT result in which the power source, the package, and the measurement system are considered.

Figure 3:
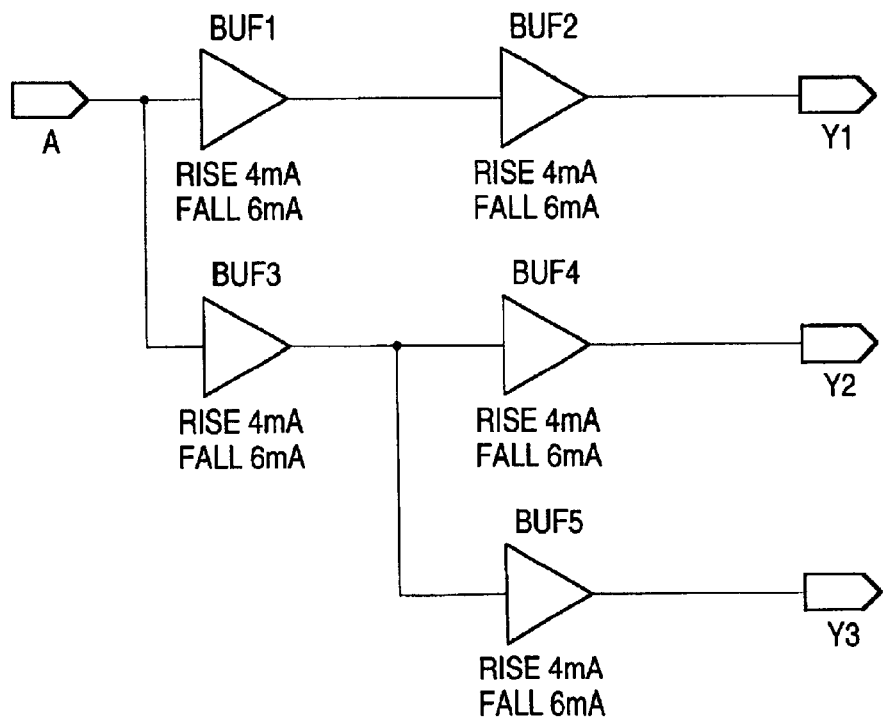
FIG. 3 is a diagram showing an example of a netlist which is used in the method of analyzing electromagnetic interference in the first embodiment of the invention.
Figure 4:
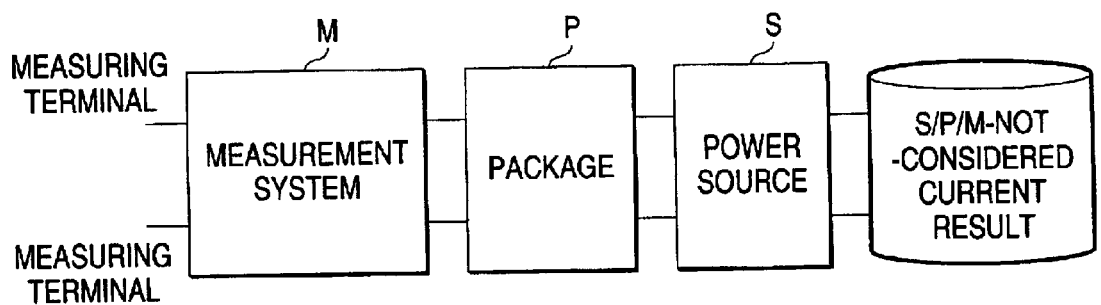
FIG. 4 is an equivalent circuit diagram showing power source/package/measurement system RLC information which is used in the method of analyzing electromagnetic interference in the first embodiment of the invention.
Figure 10:
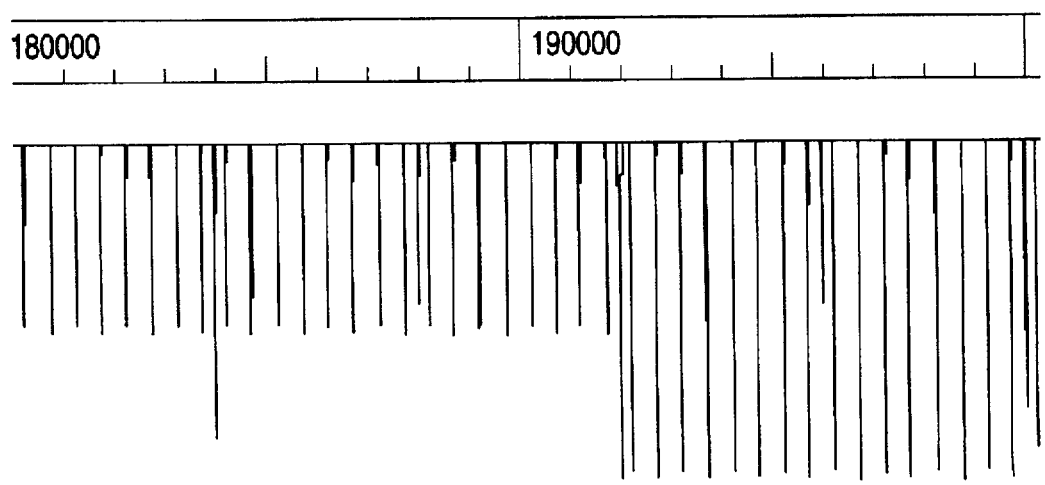
FIG. 10 shows an example of a frequency spectrum corresponding to the data of FIG. 8 which are used in the first embodiment of the invention.

FIG. 3 shows an example of the netlist. The figure shows an inverter circuit. The netlist information is configured by connection information among one or more circuit elements, lines, and external terminals, and information of a current when each of the circuit elements is driven. The example is configured by: buffers BUF1, BUF2, BUF3, BUF4, and BUF5 in each of which a current of 4 mA flows at rising and a current of 6 mA flows at falling; an external input terminal A; external output terminal Y1, Y2, and Y3; and lines connecting these components. FIG. 3 shows circuit information of an LSI chip in the case where a power source that is used for calculating a power source/package/measurement system non-considered current such as shown in FIG. 10 is set as an ideal power source. FIG. 4 shows a result of modeling the power source/package/measurement system non-considered current to an equivalent power source current, and the circuit information and the power source/package/measurement system RLC information to an equivalent impedance.

As shown in FIG. 4, an equivalent circuit including the package of the LSI device on which a simulation is to be performed, and the measurement system is configured by a package portion P, a power source circuit portion S, and a measurement system M. In this equivalent circuit, the package portion, the power source circuit portion, and the measurement system are independently formed. However, the package portion, the power source circuit portion, and the measurement system are not required to be independently formed.

When the measurement system is modeled as described above, the simulation result can correlate with a result of measurement of an LSI measurement system (measuring apparatus) which will be standardized.

Figure 5:
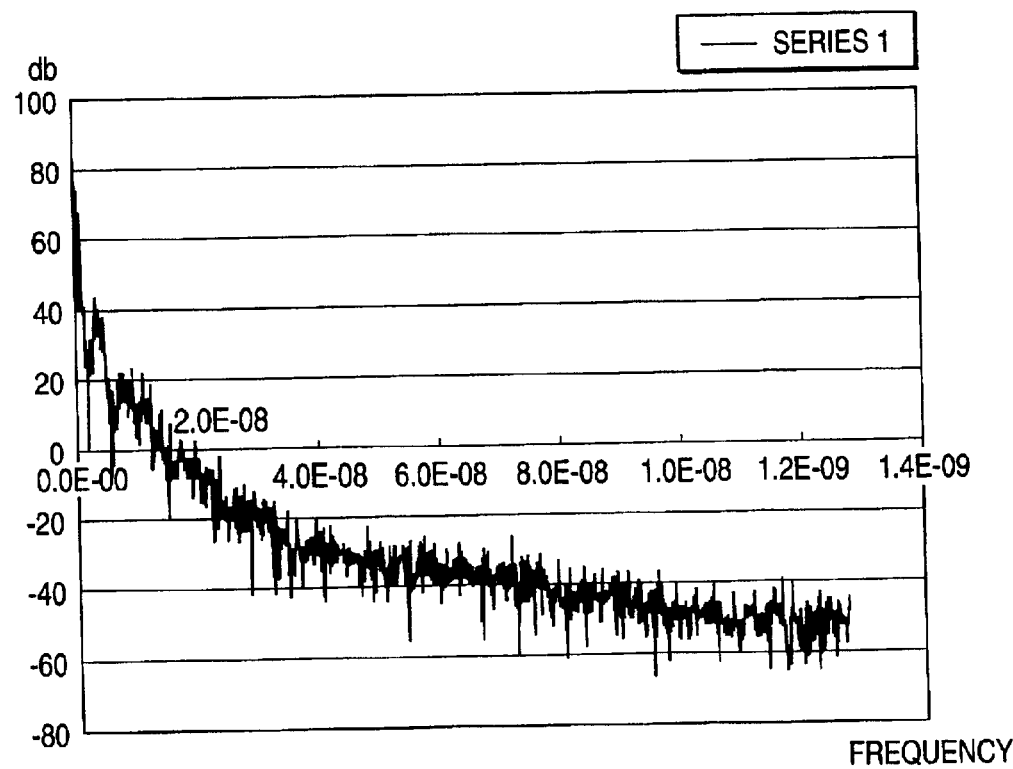
FIG. 5 shows an example of a frequency spectrum which is obtained by the method of analyzing electromagnetic interference in the first embodiment of the invention.

FIG. 5 shows a frequency spectrum which is an FFT result that is finally obtained by the invention. In the figure, the ordinate indicates noise (dBmA), and the abscissa indicates the frequency (Hz).

Figure 7:
FIGS. 7(a)–7(d) are views showing waveform models which are expressed by optimum modeling that is used for realizing power source/package/measuring apparatus non-considered current inferring means in the first embodiment of the invention by using a logical simulator.
Figure 7:
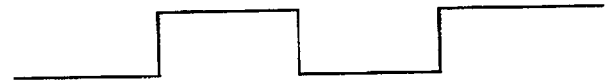
Figure 7:
Figure 7:

In FIG. 7, an inferred current waveform of each logical change in a digital simulation is expressed as a waveform of a Japanese chess piece-like shape or a triangular shape having a rectangle as shown in (a) to (d). When the decoupling capacitance is small, an inferred power source current has an acute angle shape as shown in (c) of FIG. 7, and, when the decoupling capacitance is large, an obtuse angle shape as shown in (d) of FIG. 7.

Figure 6:
FIGS. 6(a)–6(d) are views showing waveform models of inferred power source current models.
Figure 6:
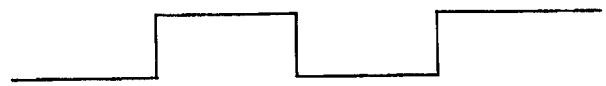
Figure 6:
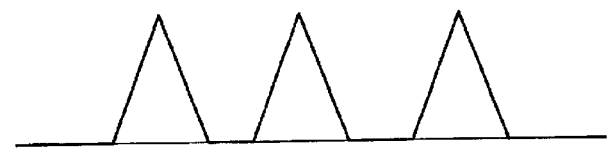
Figure 6:
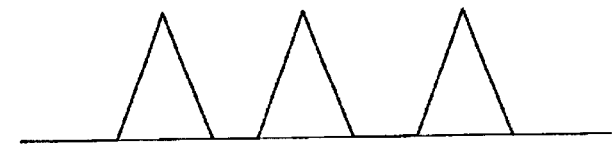

By contrast, there is a method in which an inferred power source current is expressed as a triangular wave as shown in (a) to (d) of FIG. 6. In this case, the base of a triangle is expressed by a function of a transition time. In order to consider the decoupling capacitance, therefore, the base must be adjusted. When the base is widened, not only noise of a high frequency region which is to be originally reduced by the decoupling capacitance, but also noise of a low frequency region is reduced, so that the result is different from a measured value.

In contrast, FIG. 7 shows the modeling which is optimum for realizing power source/package/measuring apparatus non-considered current inferring means by using a logical simulator. When the modeling is used, an equivalent power source current circuit can be realized in a form similar to an actual one.

In this method, the base can be expressed by a function of a transition time, and the side faces can be expressed by a function of a decoupling capacitance. Therefore, an influence of the decoupling capacitance on a frequency spectrum (FFT result) can be correctly expressed.

Figure 8:
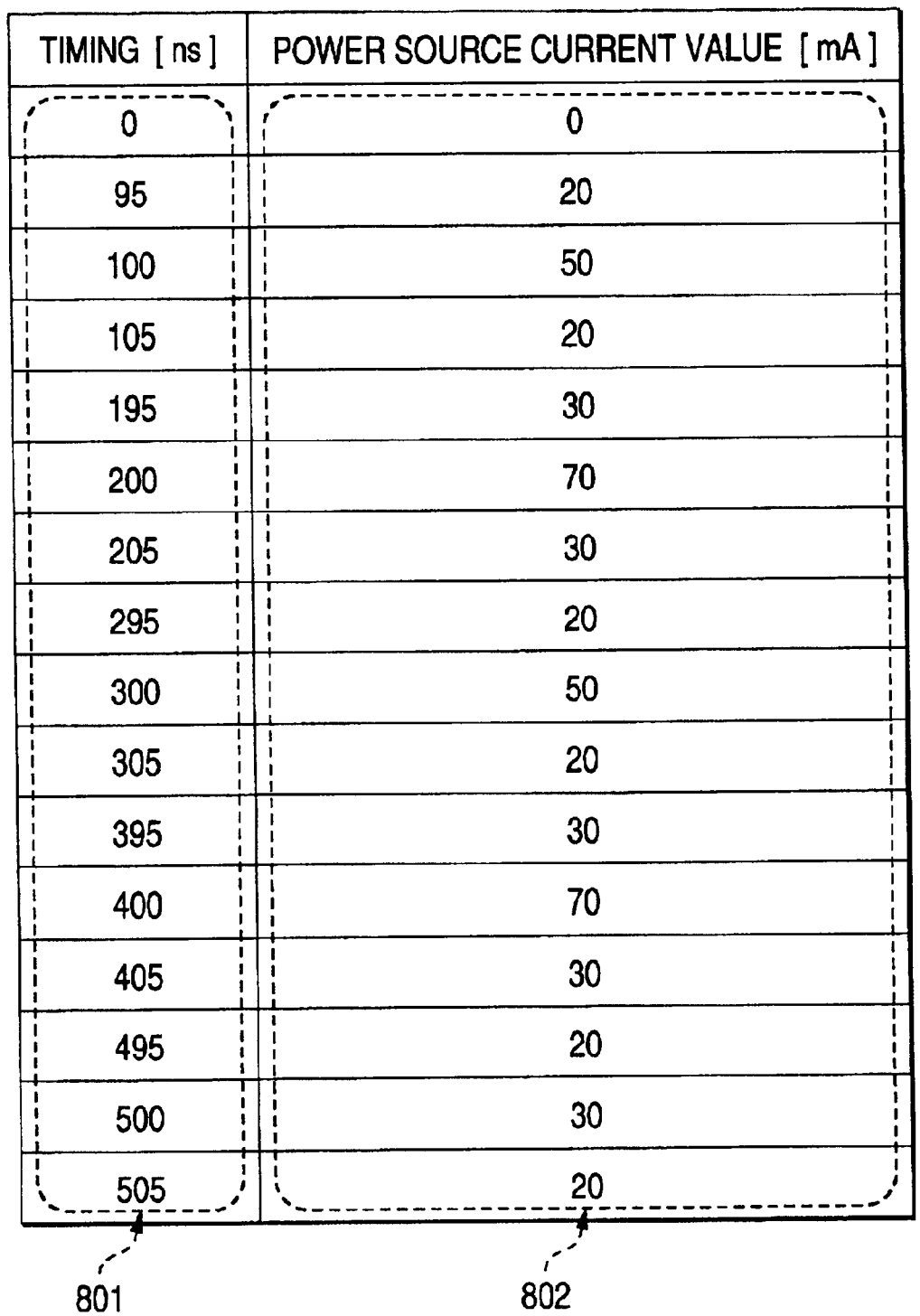
FIG. 8 is a view showing an example of data used in the first embodiment of the invention.

FIG. 8 shows power source/package/measuring apparatus non-considered current information which is calculated by power source/package/measuring apparatus non-considered current inferring means by using such a model. The current information is configured of information of times and power source current values, and is information in the case where the power source current shown in FIG. 10 is expressed in the form of numerical data.

Figure 9:
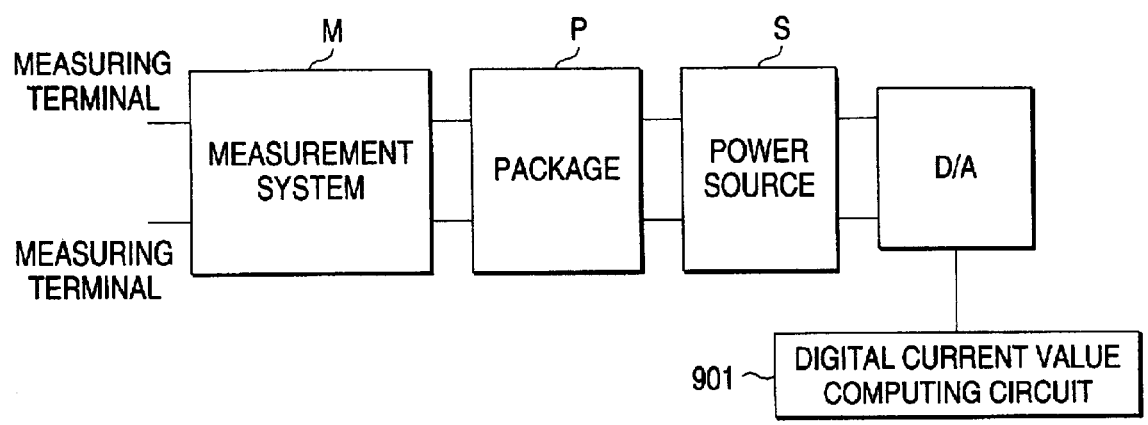
FIG. 9 is a diagram showing a method of calculating an equivalent power source current in the first embodiment of the invention.

FIG. 9 shows an example of a method of converting the power source current information into an equivalent power source current. A D/A converter 901 is connected to terminals of an LSI chip, and the power source/package/measuring apparatus non-considered current inferring means is configured as a digital current calculating circuit 901 to the D/A converter 901, so that an equivalent power source current can be obtained. Information such as shown in FIG. 8 is calculated by the digital current calculating circuit (i.e., the power source/package/measuring apparatus non-considered current inferring means configured by a logical simulator). When the D/A converter shown in FIG. 9 is used in a subsequent process of converting the information into an equivalent power source current, a transistor-level simulator can smoothly perform a simulation on the circuit shown in FIG. 9.

When a transistor-level simulation is performed while combining an equivalent power source current circuit and an impedance circuit, the power source current which is calculated by the power source/package/measuring apparatus non-considered current inferring means can be corrected, and a power source/package/measuring apparatus non-considered current can be inferred. When the inferred current is subjected to FFT, it is possible to obtain the frequency spectrum shown in FIG. 5.

Next, the case where the analysis control input section 102 is implemented will be described with reference to the equivalent circuit shown in FIG. 11 and the block diagram shown in FIG. 12.

In this case, a step of performing a gate-level current calculation as power source/package/measurement system non-considered current inferring means, and a step of, with reflecting a result of the above step, performing a transistor-level calculation as power source/package/measurement system considered FFT inferring means are synchronously implemented. Specifically, while an inferred current relating to a cell, a block, or the LSI is calculated at the gate level, the calculated value is subjected to a simulation with being combined with a power source net and in synchronization with the calculation, thereby obtaining a current calculation result in which an influence of the power source net is considered.

Figure 11:
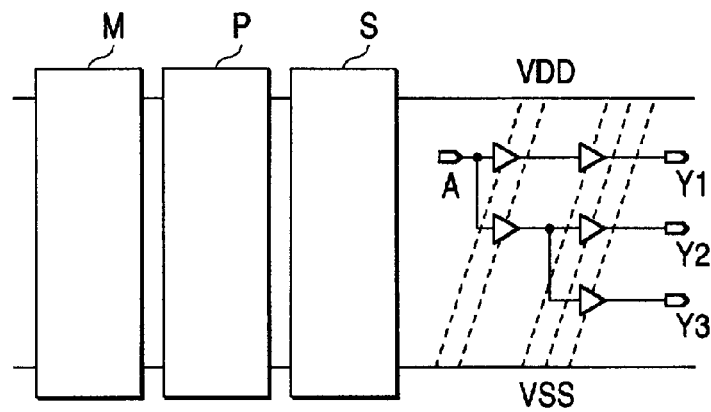
FIG. 11 is an equivalent circuit diagram showing power source/package/measurement system RLC information which is used in the method of analyzing electromagnetic interference in the first embodiment of the invention.
Figure 12:
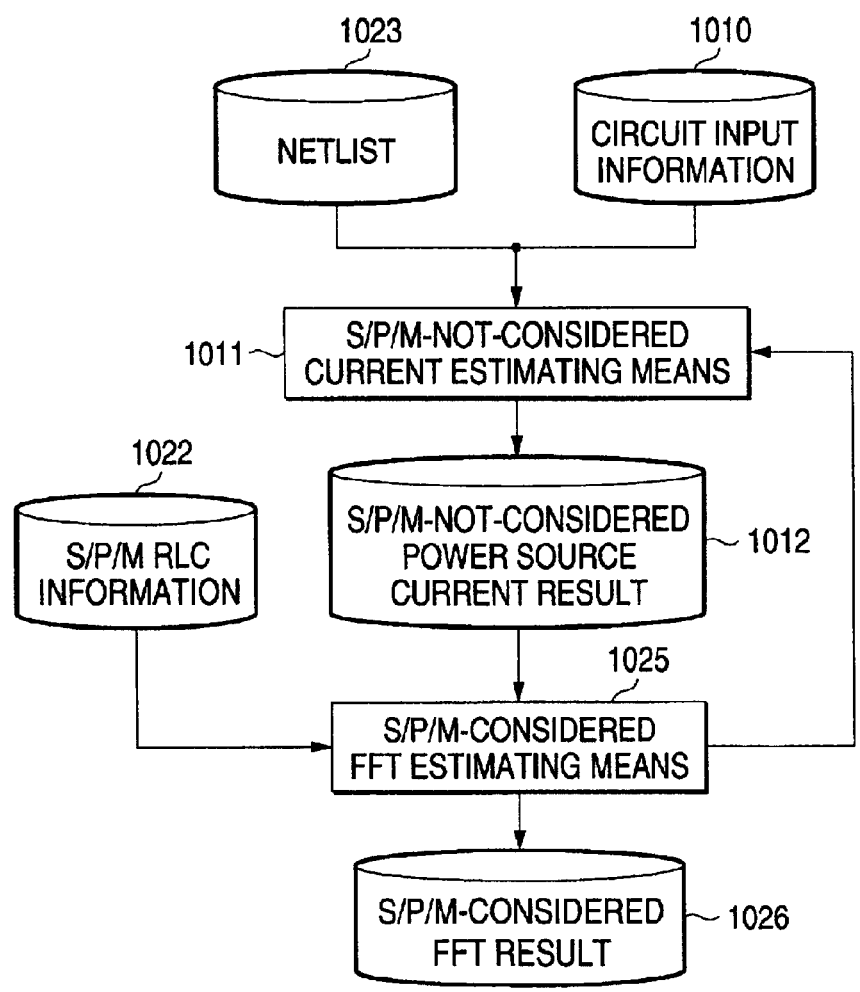
FIG. 12 is a view showing an example of data in detailed frequency storing means in the first embodiment of the invention.

As shown in the equivalent circuit of FIG. 11 and the block diagram of FIG. 12, the analysis control input section 102 shown in FIG. 1 comprises: a power source/package/measurement system non-considered current result 1012 which is obtained from power source/package/measurement system non-considered current inferring means 1011 by means of synchronous reading; the equivalent circuit estimating means 1021 for adding at least one of the power source information of the power source for supplying a current to the LSI chip, the package information of the package for the semiconductor chip, and the measurement system information of the measurement system for measuring characteristics of the semiconductor chip, as analysis control information, and for estimating the power source/package/measurement system RLC information 1022 in which the analysis control information is added to the circuit information, as an equivalent circuit; and the power source/package/measurement system considered FFT inferring means 1025 for, on the basis of the equivalent circuit obtained by the equivalent circuit estimating means 1021, performing frequency analysis by a method such as an FFT process from a total impedance serving as the power source/package/measurement system RLC information 1022 due to the power source/package/measurement system, to calculate an inference result. The analysis control input section outputs the FFT result 1026 in which the power source, the package, and the measurement system are considered.

Figure 13:
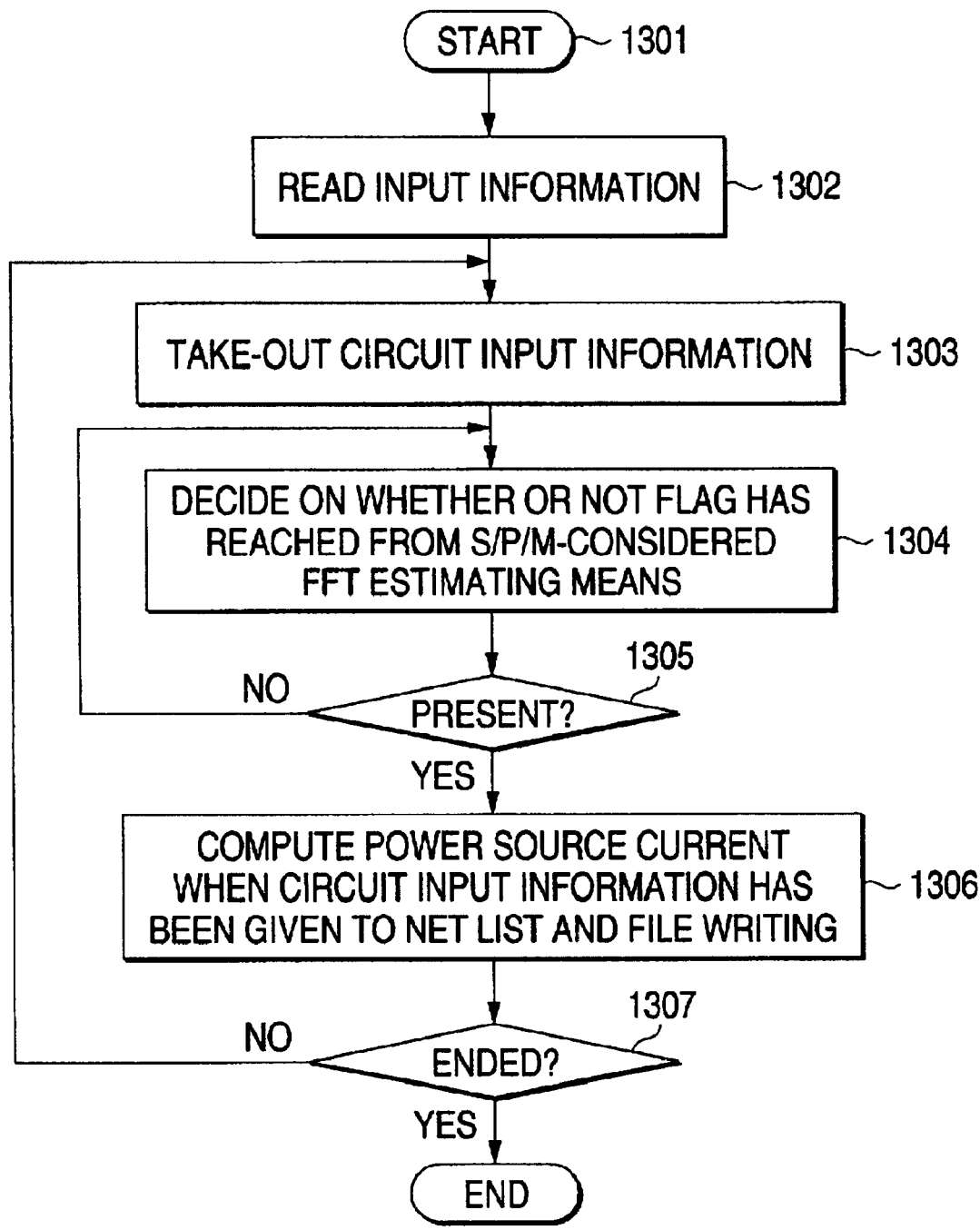
FIG. 13 is a flowchart showing an inferring method of power source/package/measurement system non-considered inferring means in the first embodiment of the invention.
Figure 14:
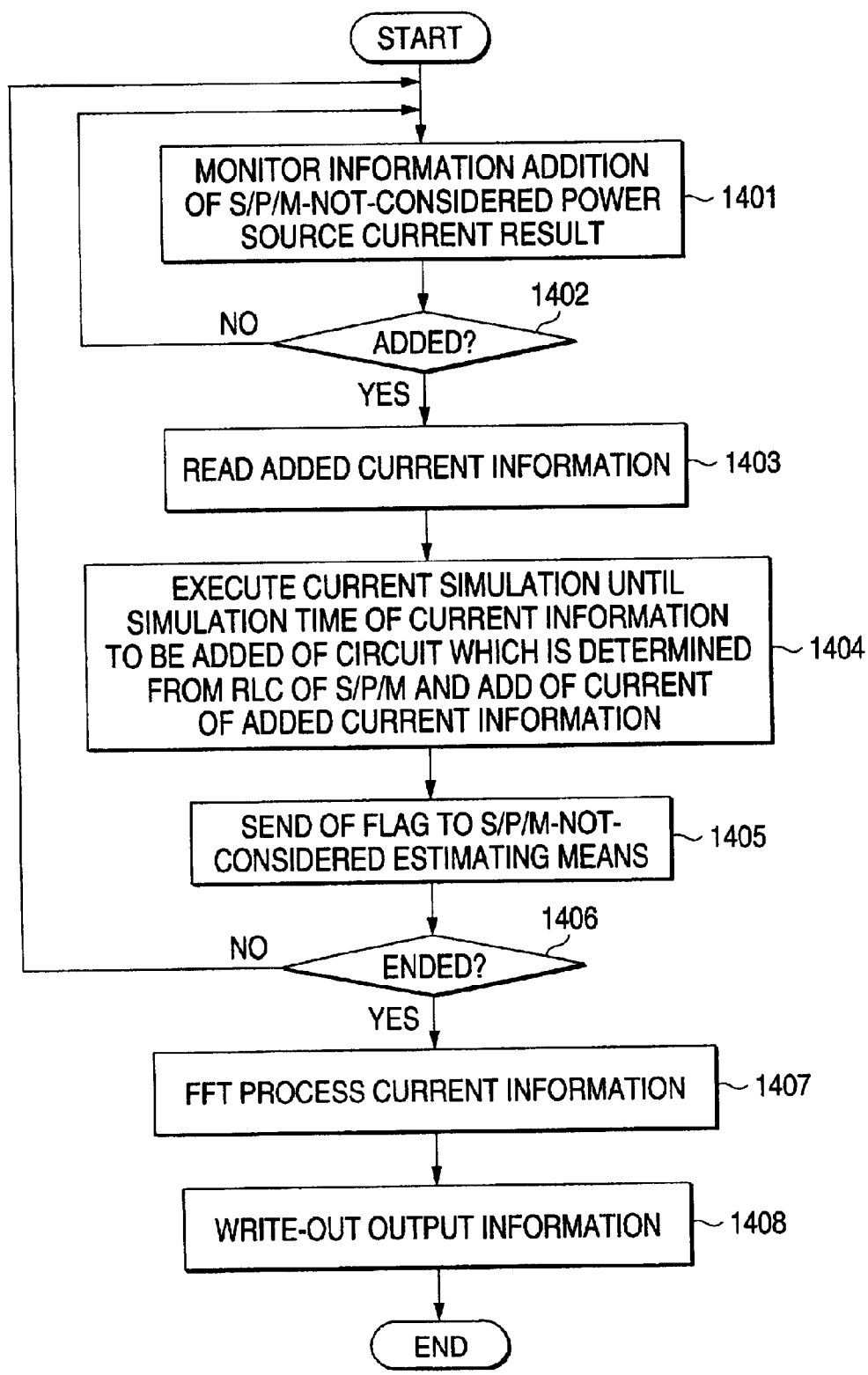
FIG. 14 is a flowchart showing an inferring method of power source/package/measurement system considered inferring means in the first embodiment of the invention.

FIGS. 13 and 14 are flowcharts respectively showing the operations of the power source/package/measurement system non-considered current inferring means, and power source/package/measurement system considered current inferring means.

As shown in FIG. 13, the current inference in the power source/package/measurement system non-considered current inferring means 1011 is configured by: a step 1301 of inputting the netlist 1023 and circuit input information 1010; a step 1302 of reading the input information; a step 1303 of fetching line by line the read circuit input information; a step 1304 of checking flags in order to judge whether a flag is sent from the power source/package/measurement system considered current inferring means or not; and a step 1306 of, if it is judged in a step 1305 of judging whether the flag exists or not, that the flag is sent, or if the fetched circuit input information is in the initial line, calculating the power source current when the fetched circuit input information is given to the netlist, and writing the calculated power source current into a file. It is judged whether the process on all of circuit input information is ended or not (step 1307). If the process is ended, the current inference is ended.

The circuit input information is a representation in time sequence of input values which are applied to external input terminals of a netlist. Specifically, each simulation time and a logical signal value which is applied to the external input terminals at the time are accommodated in one line, and such lines are described till the end time of a simulation.

If it is judged in the judgement step 1307 that the process on all the lines of circuit input information is not ended, the control returns to the circuit input information fetching step 1303, and then repeats the same steps.

If the flag is not sent from the power source/package/measurement system considered current inferring means, it is again checked whether the flag is sent or not.

As shown in FIG. 14, the current inference by the power source/package/measurement system considered current inferring means has step 1401 which monitors information addition of an inference result in the power source/package/measurement system non-considered current inferring means. It is judged whether information addition is performed in the monitoring step or not (step 1402). If it is judged that information addition is performed, the additional current information is read (step 1403).

Then, a current simulation of the additional current information of a circuit defined by RLC of the power source/package/measurement system is performed till the simulation time to apply the current of the additional current information (step 1404), and the flag is sent to the power source/package/measurement system considered current inferring means 1011 (step 1405).

It is judged whether the sending of the flag is ended or not (step 1406). If ended, an FFT process is performed on the current information (step 1407), and output information is written out (step 1408).

If the sending of the flag is not ended, the control returns to the monitoring step 1401 which monitors information addition of an inference result in the power source/package/measurement system non-considered current inferring means, and the subsequent steps are repeated.

Embodiment 2

Next, a second embodiment of the invention will be described.

In the embodiment, a method is employed in which a result of a current calculation at the gate level as power source/package/measurement system non-considered current inferring means is reflected in a calculation at the transistor level in post-processing. Specifically, an inferred current related to a block or an LSI is calculated at the gate level, and the calculated value is subjected to a simulation with being combined with a power source net, thereby obtaining a current calculation result in which an influence of the power source net is considered.

Figure 15:
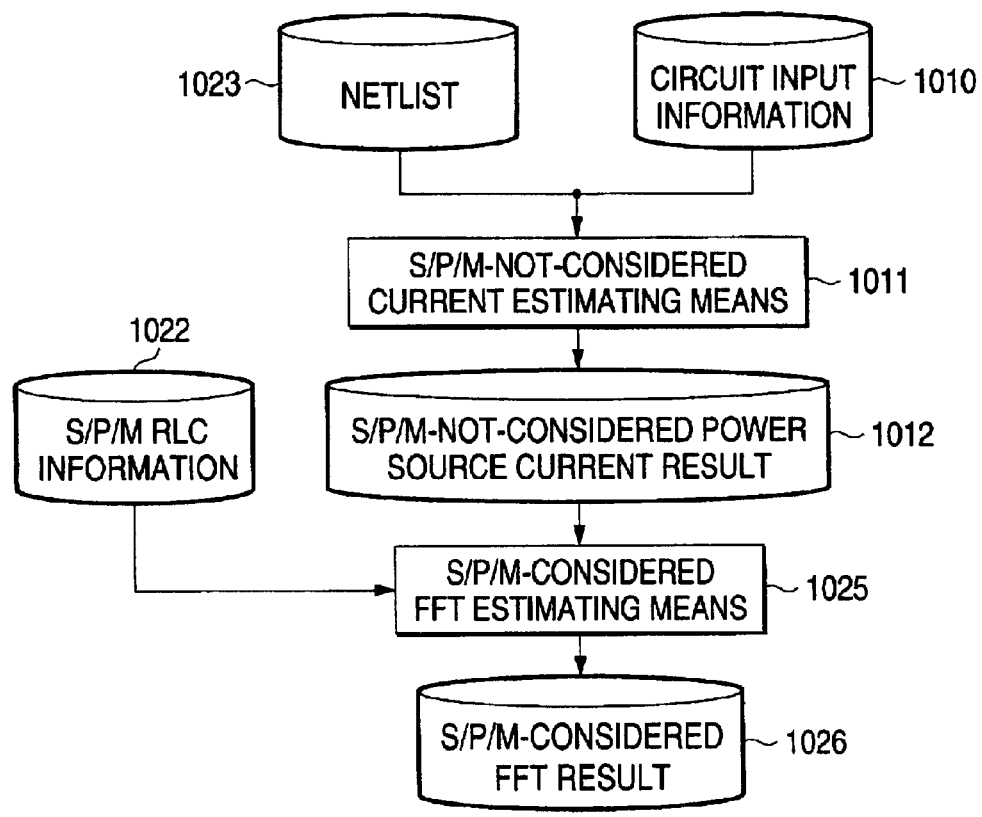
FIG. 15 is a flowchart showing a synchronous reading method in a second embodiment of the invention.

FIG. 15 shows an operation method of reflecting a result of a current calculation at the gate level into a calculation at the transistor level in post-processing. The steps of the method are identical with those of FIG. 12 except that the step of propagating the flag from the power source/package/measurement system considered current inferring means to the power source/package/measurement system non-considered current inferring means which step is necessary for synchronization in the synchronous reading operation described in FIG. 12 is eliminated.

Figure 16:
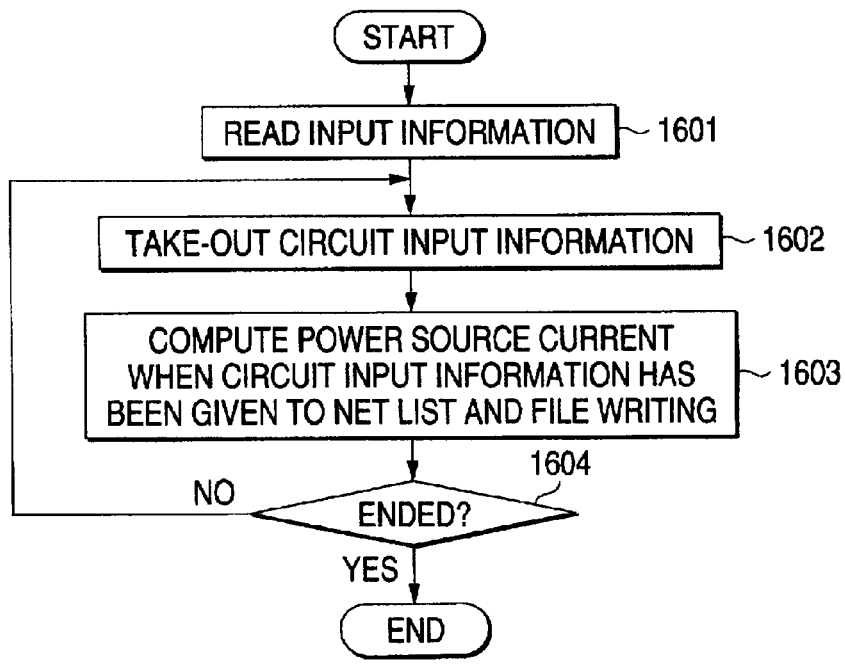
FIG. 16 is a flowchart showing an inferring method of power source/package/measurement system non-considered inferring means in the second embodiment of the invention.

FIG. 16 shows the inferring operation of the power source/package/measurement system non-considered current inferring means 1011. In this operation, the circuit input information 1010 is read as input information (step 1601), and corresponding circuit input information is fetched line by line (step 1602). The fetched circuit input information is added to the netlist 1023, the power source current at this time is calculated, and a file writing operation is performed (step 1603). It is judged whether the process on all of circuit input information is ended or not judgement step 1604). If it is judged that the process is ended, the inferring operation is ended.

By contrast, if it is judged in step 1604 that the process is not ended, the control returns to step 1602 in which circuit input information is fetched line by line, and repeats the above-mentioned operations.

Figure 17:
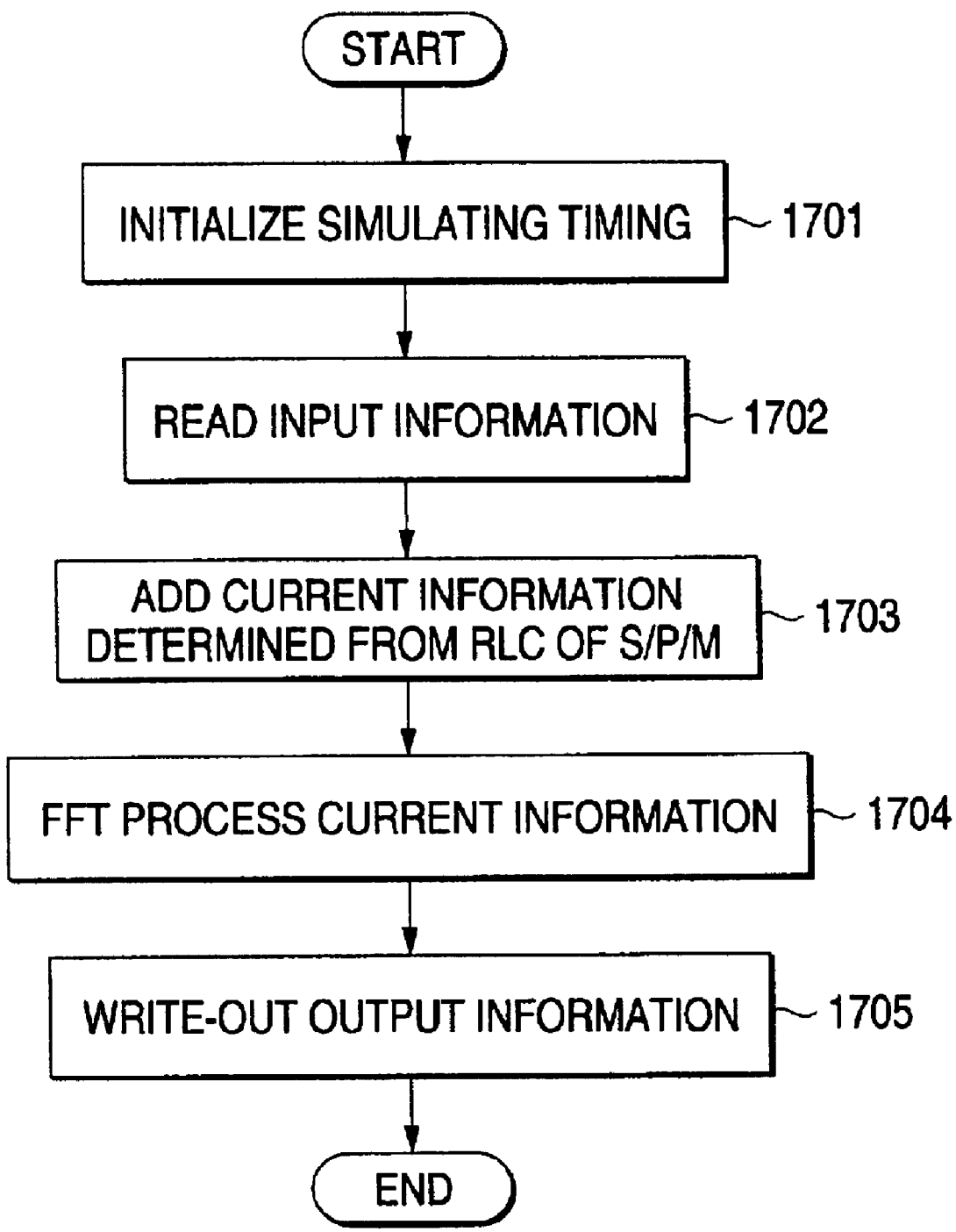
FIG. 17 is a flowchart showing an inferring method of power source/package/measurement system considered inferring means in the second embodiment of the invention.

FIG. 17 shows the inferring operation of the power source/package/measurement system considered current inferring means 1025. First, the simulation time is initialized (step 1701). The circuit input information 1010 is read as input information (step 1702). Corresponding circuit input information is added to the power source/package/measurement system RLC information, and the current information is calculated (step 1703). An FFT process is performed on the current information (step 1704). An FFT result which is obtained in this way is written out as output information (step 1705), and output to a display device.

According to this configuration, it is possible to correctly express an influence of the power source net on the FFT result from also the viewpoint of time sequence. In the case of such an asynchronous reading, a flag is not sent, and hence a process of sending a flag can be omitted. As a result, processing can be performed at a higher speed as compared with the case of synchronous reading.

Embodiment 3

Next, a third embodiment of the invention will be described.

In the embodiment, a method is employed in which a result of a current calculation at the gate level as power source/package/measurement system non-considered current inferring means is asynchronously reflected in a calculation at the transistor level. Specifically, a signal change relating to a cell, a block, or an LSI is stored, the signal change is read at fixed intervals, and an inferred current is expressed as a current source by means of D/A conversion or the like, and subjected to a simulation with being combined with a power source net, thereby obtaining a current calculation result in which an influence of the power source net is considered.

FIG. 15 shows an asynchronous reading operation of asynchronously reading a result of a current calculation at the gate level. The operation is strictly identical with the operation method which has been described in Embodiment 2, and in which the result is reflected in a calculation at the transistor level in post-processing.

Also the inferring operation of the power source/package/measuring apparatus non-considered current inferring means 1011 is strictly identical with the operation shown in FIG. 16 which has been described in Embodiment 2.

Figure 18:
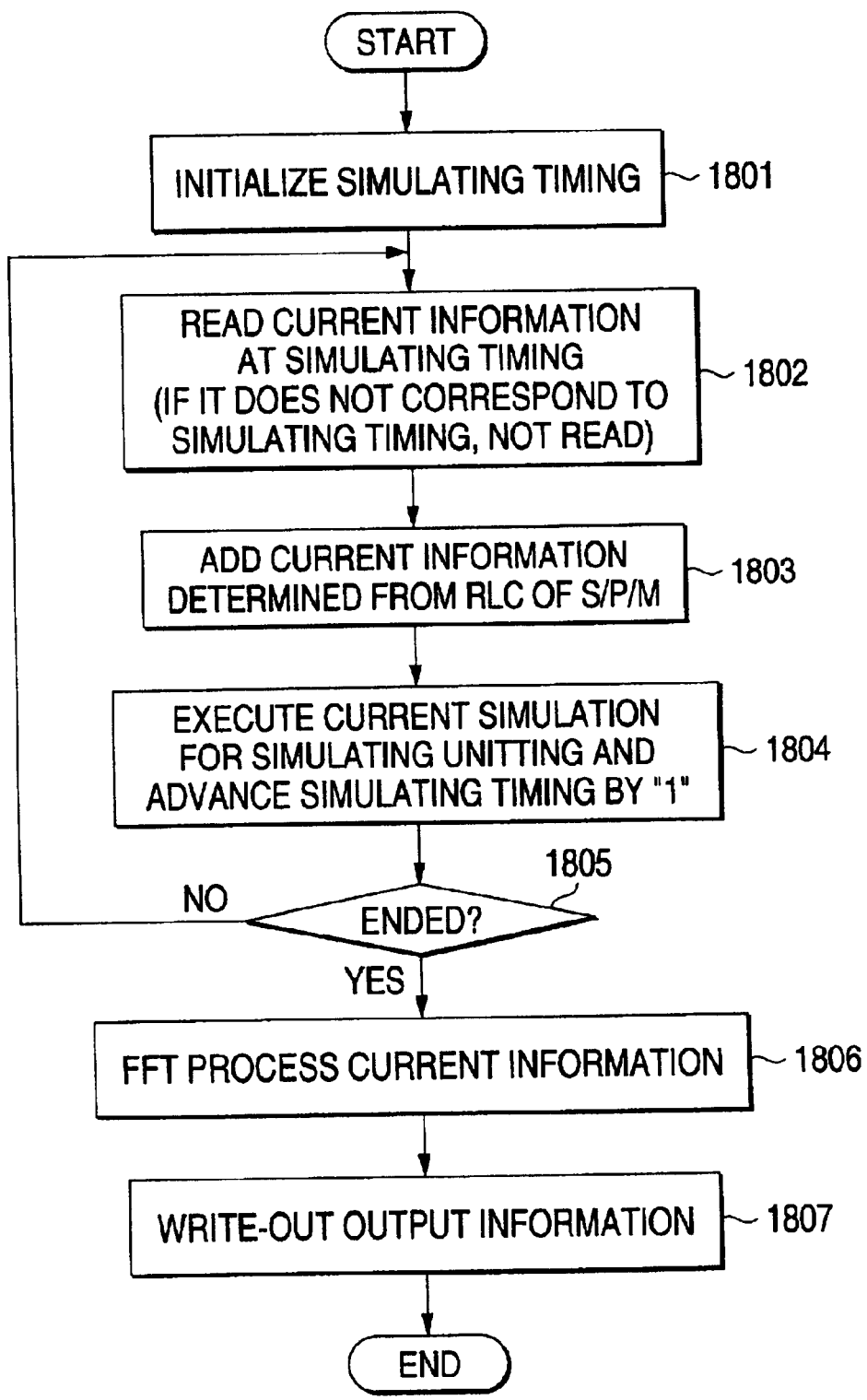
FIG. 18 is a flowchart showing an inferring method of power source/package/measurement system considered inferring means in a third embodiment of the invention.

FIG. 18 shows the inferring operation of the power source/package/measurement system considered current inferring means 1025. First, the simulation time is initialized to 0 (step 1801). The circuit input information 1011 at the simulation time is read as input information (step 1802, in the embodiment, if the circuit information fails to coincide with the simulation time, the reading is skipped). Corresponding circuit input information is added to the power source/package/measurement system RLC information (step 1803).

Then, a current simulation in a simulation unit time period is performed to obtain a current value, and thereafter the simulation time is incremented by 1 (step 1804).

It is judged whether the simulation object time period is ended or not (step 1805). If ended, an FFT process is performed on the current information (step 1806). An FFT result which is obtained in this way is written out as output information (step 1807), and output to a display device.

If it is judged in judgment step 1805 that the time period is not ended, the control returns to the step 1802 of reading the current information at the simulation time, and the subsequent steps are repeated.

According to this configuration, it is possible to correctly express an influence of the power source net on the FFT result. Since the reading is performed at the step intervals as described above, a digital portion serving as the power source/package/measurement system non-considered current inferring means can be calculated while the speed of the calculation is not controlled by the processing speed of an analog portion serving as the power source/package/measurement system considered FFT inferring means.

Embodiment 4

Next, a fourth embodiment of the invention will be described.

In the embodiment, a method is employed in which an average or maximum value of a current calculation at the gate level is reflected in a calculation at the transistor level. Specifically, an inferred current relating to a cell, a block, or an LSI is calculated at the gate level as power source/package/measurement system non-considered current inferring means, and a value which is obtained by averaging or maximizing the calculated value at each cycle is subjected to a simulation with being combined with a power source net, thereby obtaining a current calculation result in which an influence of the power source net is considered.

Figure 19:
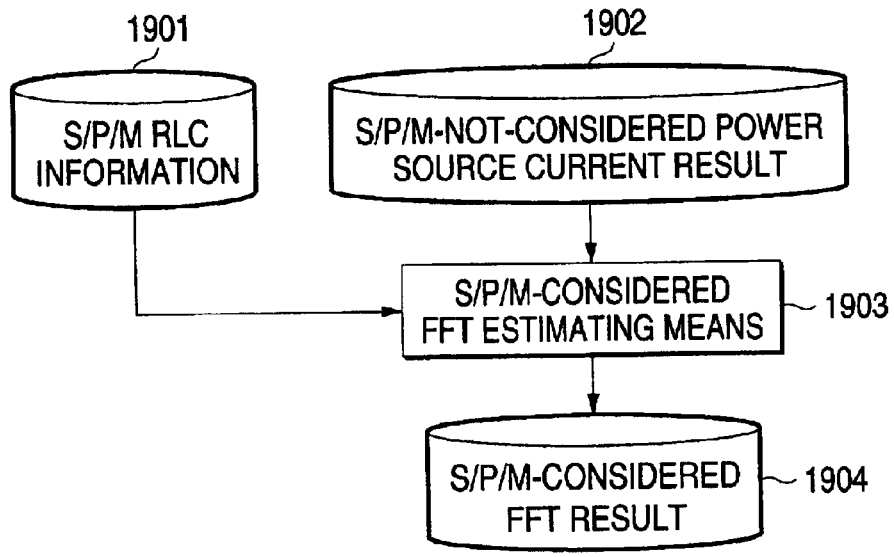
FIG. 19 is a flowchart of FFT analysis in a fourth embodiment of the invention.

FIG. 19 shows an operation method in which a result of the current calculation at the gate level as power source/package/measurement system current inferring means is reflected in a calculation at the transistor level as power source/package/measurement system considered FFT inferring means in post-processing. The embodiment is similar to the method of Embodiment 1 and shown in FIG. 12, and configured in the following manner. As shown in the block diagram of FIG. 19, a current value of each cycle in a measurement system non-considered power source current result 1902 which is obtained by power source/package/measurement system considered current inferring means (not shown) is averaged or maximized so as to be convoluted into one cycle is set as an equivalent current source. The embodiment comprises information inferring means for performing a simulation with to the equivalent current source RLC information 1901 in which at least one of power source information of a power source for supplying a current to the LSI chip, package information of a package for the semiconductor chip, and measurement system information of a measurement system for measuring characteristics of the semiconductor chip, as analysis control information to the circuit information, and for performing an FFT process and calculating an inference result. An FFT result 1904 in which the power source, the package, and the measurement system are considered is output.

Figure 20:
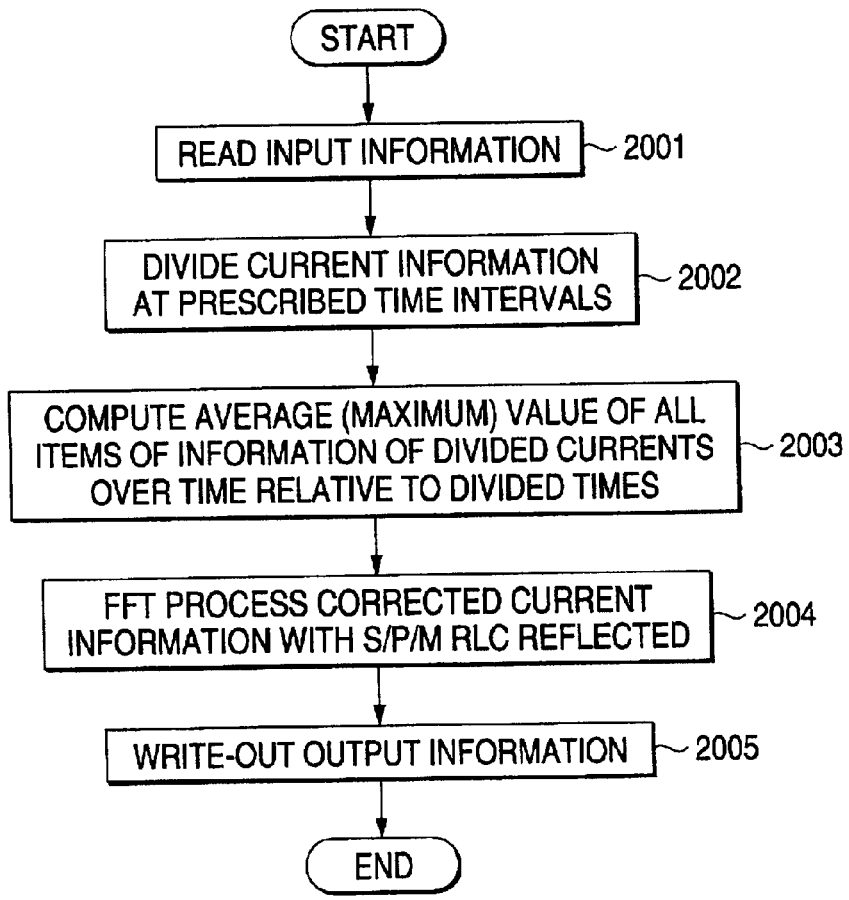
FIG. 20 is a flowchart showing an inferring method of power source/package/measurement system considered inferring means in the fourth embodiment of the invention.
Figure 21:
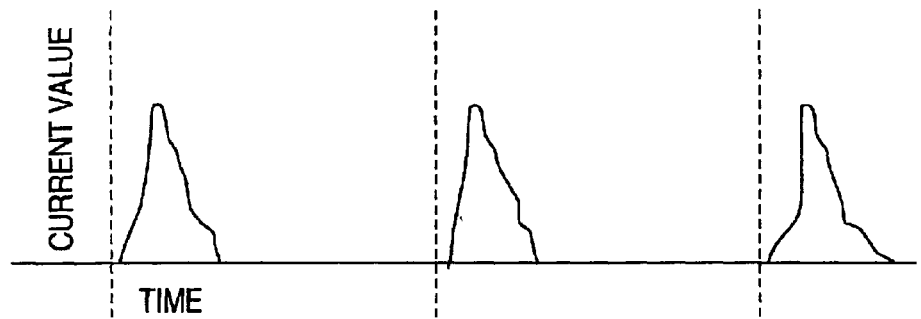
FIG. 21 is a view showing current information in the fourth embodiment of the invention.
Figure 22:
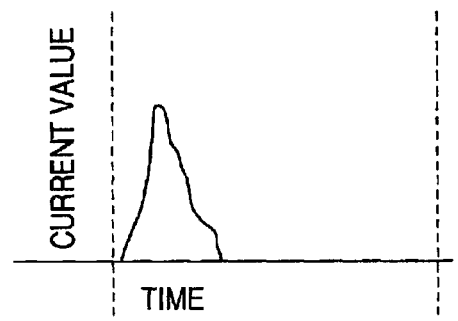
FIG. 22 is a view showing averaged current information in the fourth embodiment of the invention.

FIG. 20 shows an inferring operation of power source/package/measurement system considered current inferring means 1903. In this operation, the power source/package/measurement system non-considered current result and power source/package/measurement system RLC information are read as input information (step 2001). As an example shown in FIG. 21, the input current information is divided at predetermined time intervals (step 2002), and an average value or a maximum value of whole divided current information is calculated with a relative time in which the divided time is used as a reference (step 2003). FIG. 22 shows an averaged current which is obtained by averaging the current information shown in FIG. 21. In FIGS. 21 and 22, the ordinate indicates the current value, and the abscissa indicates the time. Then, an FFT process is performed on corrected current information in which the power source/package/measurement system RLC information is reflected in the thus calculated current information (step 2004), and a calculated FFT result is written out as output information (step 2005).

According to this configuration, it is possible to correctly express an influence of the power source net on the FFT result. Since the averaging or maximizing processing is performed at constant intervals, an influence of noise can be rapidly estimated.

Embodiment 5

Next, a fifth embodiment of the invention will be described.

In the embodiment, a method is employed in which a result of a current calculation at the gate level is reflected in a calculation at the transistor level while a change outside the object frequency band is removed away from the current calculation result. Specifically, an inferred current relating to a cell, a block, or an LSI is calculated at the gate level as power source/package/measurement system non-considered current inferring means, the calculated value is subjected to FFT, frequency bands other than the object frequency band are removed away from a result of the FFT, a result of the removal is subjected to inverse FFT, and a result of the inverse FFT is subjected to a simulation with being combined with a power source net as a current source, thereby obtaining a current calculation result in which an influence of the power source net is considered.

The invention uses the same configuration as that of the block diagram FIG. 19 of Embodiment 4.

The measurement system non-considered power source current result 1902 which is obtained by the power source/package/measurement system considered current inferring means (not shown) is subjected to FFT, frequency bands other than the object frequency band are removed away from a result of the FFT, a result of the removal is subjected to inverse FFT, and a result of the inverse FFT is set as the equivalent current source. The embodiment comprises information inferring means for performing a simulation with adding to the equivalent current source the RLC information 1901 in which at least one of power source information of a power source for supplying a current to the LSI chip, package information of a package for the semiconductor chip, and measurement system information of a measurement system for measuring characteristics of the semiconductor chip is added as analysis control information to the circuit information, and for performing an FFT process to calculate an inference result. The FFT result 1904 in which the power source, the package, and the measurement system are considered is output.

Figure 24:
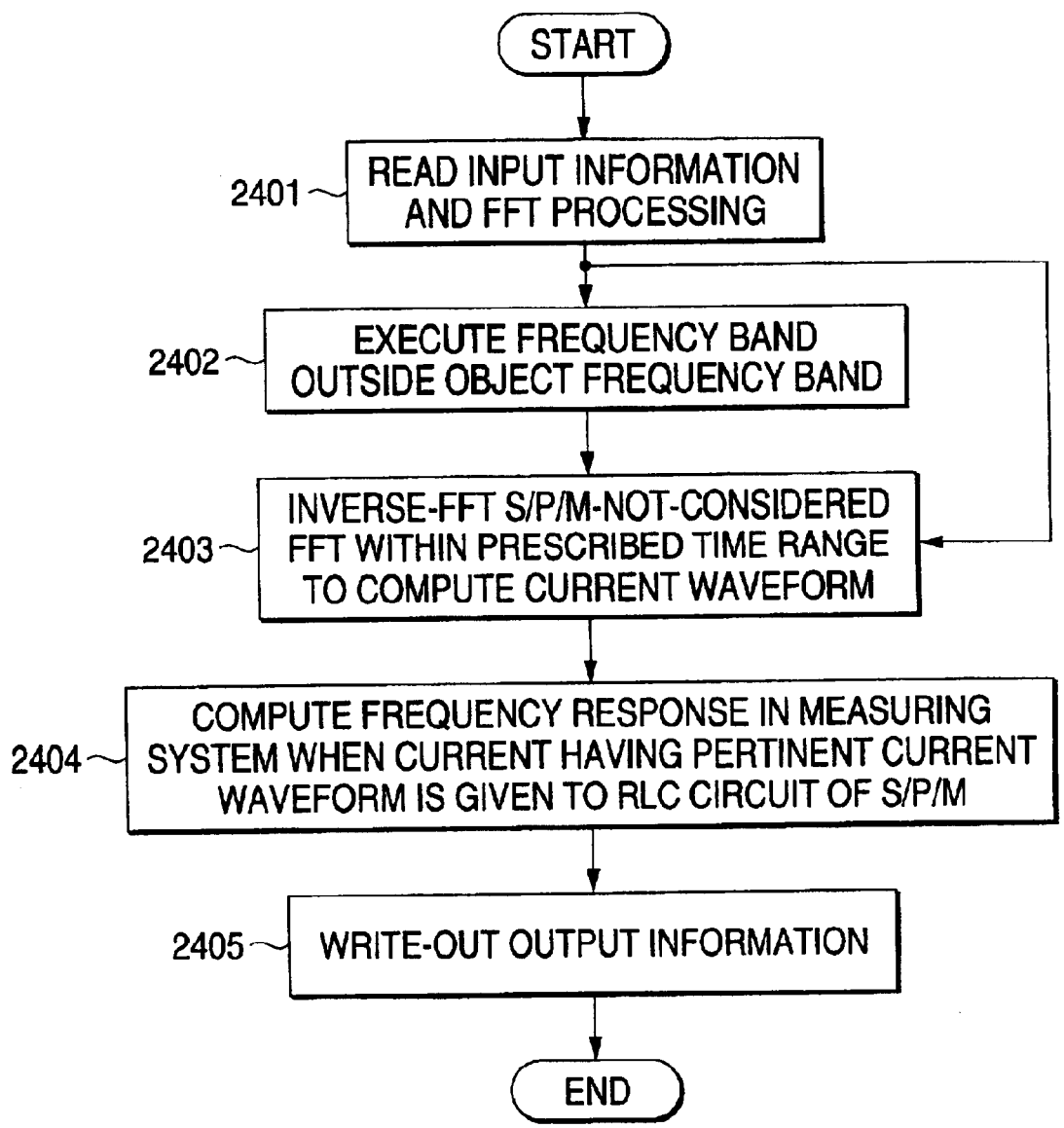
FIG. 24 is a flowchart showing an inferring method of power source/package/measurement system considered inferring means in the fifth embodiment of the invention.

FIG. 24 shows inferring operation of power source/package/measurement system considered FFT current inferring means 1903. In this operation, an inferred current which is obtained by power source/package/measurement system non-considered current inferring means (not shown) is input to be subjected to an FFT process (step 2401). Frequency bands other than the object are removed away from the input information (step 2402). A process of removing components other than those of a frequency band in a predetermined time range is performed, and a result of the process is subjected to inverse FFT to calculate a current waveform (step 2403).

Thereafter, a frequency response of a measuring apparatus in the case where a current having the current waveform is given to an RLC circuit of a power source/package/measurement system is calculated (step 2404), and a current value in which the power source, the package, and the measurement system are considered is output as output information (step 2405).

According to this configuration, it is possible to correctly express an influence of the power source net on the FFT result. Since FFT and inverse FFT are performed, information of the current source can be reduced so that the transistor-level simulation can be finished within a short time period. The embodiment is of the event driven type, and hence also analysis from a block or plural FFT results can be performed.

The step 2402 may be omitted. Even when the step is omitted, it is possible to attain the effect that information of an inferred current can be compressed by inverse FFT.

Embodiment 6

Next, a sixth embodiment of the invention will be described. In the first to fifth embodiments, equivalent power source information is obtained from circuit information, and subjected to a simulation with being combined with a total impedance of the analysis control information and the circuit information. The method of the embodiment is characterized in that a total impedance is calculated from an equivalent circuit of the power source, the package, and the measurement system, a function which is to be used for correcting the equivalent power source current information is obtained from the total impedance, and the frequency spectrum of the equivalent power source current information is calculated by the function and corrected, thereby obtaining the frequency spectrum of the power source current information in which the power source, the package, and the measurement system are considered.

In the embodiment, a method is employed in which a result of an FFT calculation at the gate level as power source/package/measurement system non-considered current inferring means is calculated by a function obtained from power source/package/measurement system RLC information. Specifically, an inferred current relating to a cell, a block, or an LSI is calculated at the gate level, a calculated value is subjected to FFT, a frequency response of a measuring apparatus in a power source/package/measurement system is calculated, and a response result is multiplied with a power source/package/measurement system non-considered current result, thereby obtaining a current calculation result in which an influence of the power source net is considered.

Figure 23:
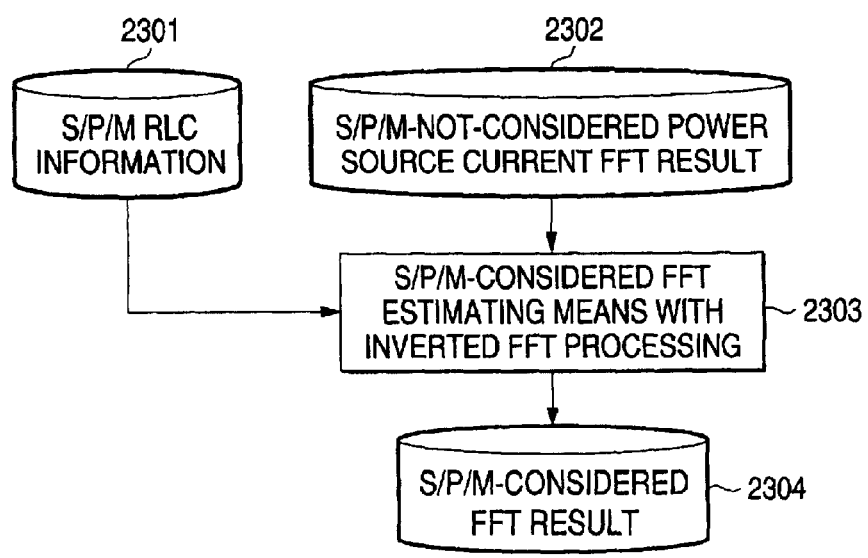
FIG. 23 is a flowchart of FFT analysis in a fifth embodiment of the invention.

FIG. 23 shows an operation method in which a result of the FFT calculation at the gate level as the power source/package/measurement system non-considered current inferring means is calculated by a function obtained from power source/package/measurement system RLC information. The embodiment is similar to the method of Embodiment 1 and shown in FIG. 12, and configured in the following manner. As shown in the block diagram of FIG. 23, current information which is obtained by performing an FFT process on an inferred current obtained from the power source/package/measurement system non-considered current inferring means (not shown) is prepared as power source/package/measurement system non-considered current FFT result 2302. An FFT result 2304 in which the power source, the package, and the measurement system are considered is output from the current information, and power source/package/measurement system RLC information 2301 configured by at least one of power source information of a power source for supplying a current to the LSI chip, package information of a package for the semiconductor chip, and measurement system information of a measurement system for measuring characteristics of the semiconductor chip.

Figure 26:
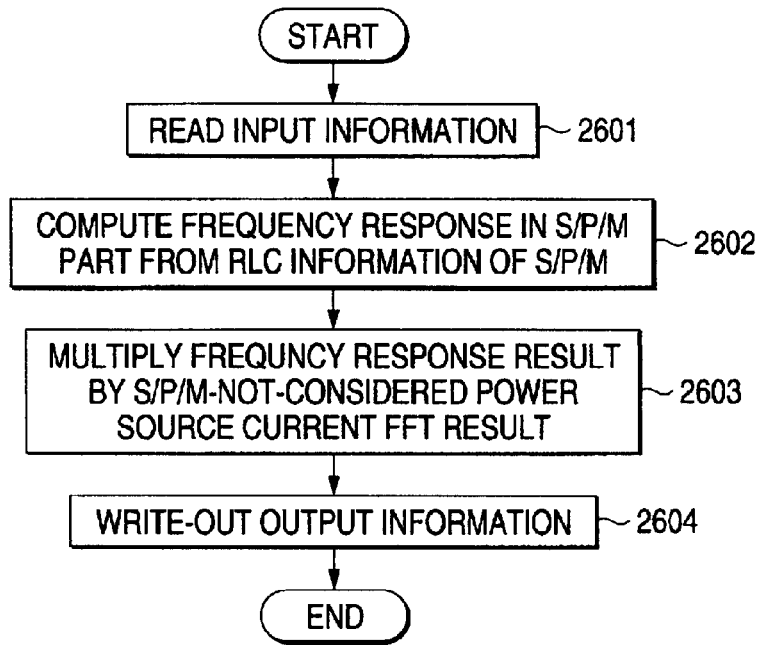
FIG. 26 is a flowchart showing an inferring method of power source/package/measurement system considered inferring means in a sixth embodiment of the invention.

FIG. 26 shows an inferring operation of power source/package/measurement system considered FFT current inferring means 2303. In this operation, information which is a result of an FFT process performed on an inferred current obtained by power source/package/measurement system non-considered current inferring means (not shown), and the power source/package/measurement system RLC information are used as input information (step 2601). The frequency response of the power source/package/measurement system is calculated from the power source/package/measurement system RLC information (step 2602). The FFT result of the power source/package/measurement system non-considered current is multiplied with a result of the frequency response (step 2603), and a resulting current value for each frequency is output as output information (step 2604).

Figure 27:
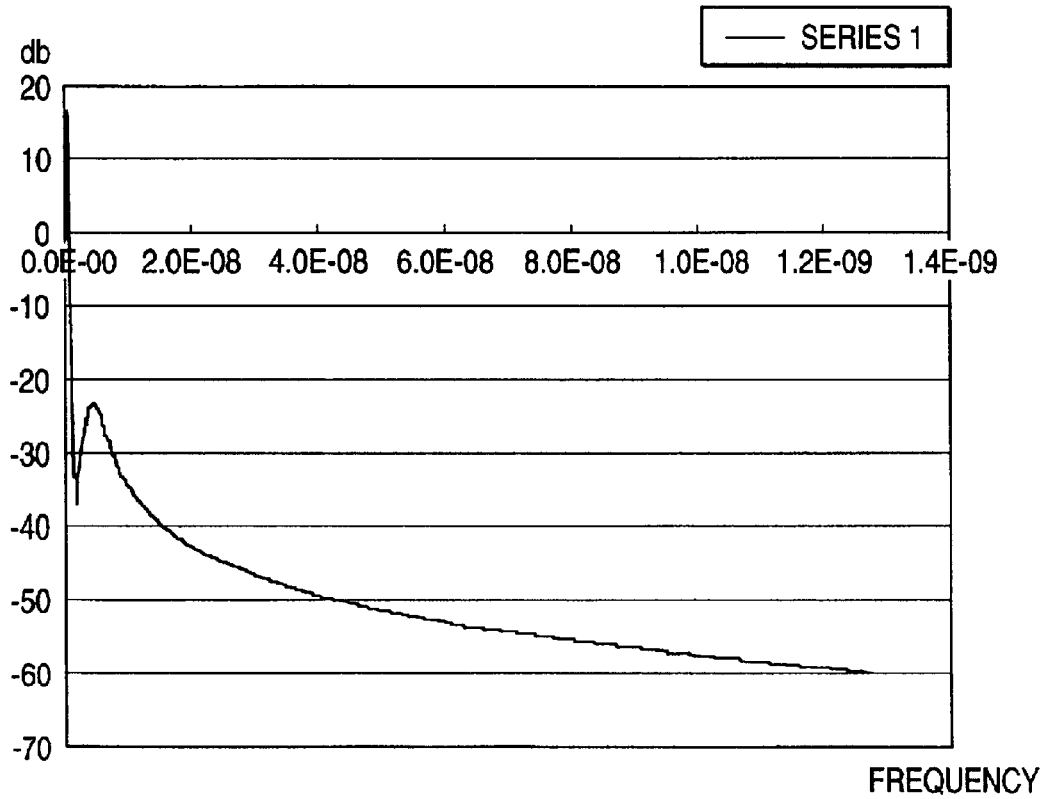
FIG. 27 is a view showing a frequency response result in the sixth embodiment of the invention.

The result of the frequency response at this time is shown in FIG. 27.

According to this configuration, an influence of the power source/package/measurement system can be reflected in the frequency spectrum, and high-speed and accurate calculation is enabled. Therefore, an influence of the FFT power source net on an FFT result can be correctly expressed. Since a response result for each frequency is subjected to a multiplication process, the embodiment has features that processing can be performed at a higher speed, and that the required memory capacity is small.

Embodiment 7

The embodiment is a modification of the inferring operation of the power source/package/measurement system considered FFT current inferring means 2303 in Embodiment 6.

In Embodiment 6, a frequency response of a measuring apparatus in a power source/package/measurement system is calculated, and a response result is multiplied with a power source/package/measurement system non-considered current result. The embodiment is characterized in that a frequency response of a measuring apparatus in a power source/package/measurement system is calculated for each frequency with respect to an FFT result of a power source/package/measurement system non-considered current result, and response results are accumulated.

Figure 25:
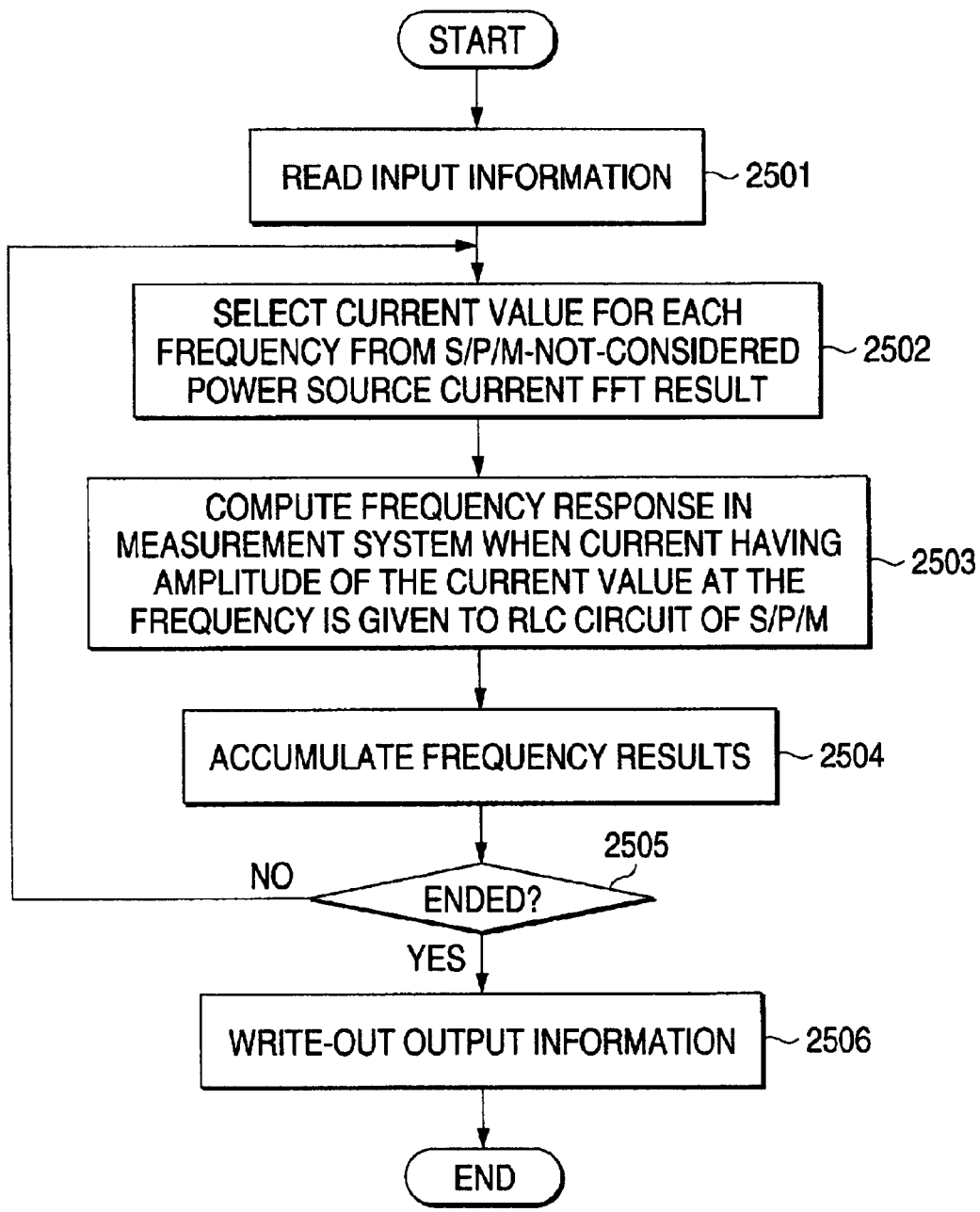
FIG. 25 is a view showing a frequency response result in a seventh embodiment of the invention.

FIG. 25 shows the inferring operation of the power source/package/measurement system considered FFT current inferring means 2303. In this operation, an FFT result of an FFT process performed on an inferred current obtained by power source/package/measurement system non-considered current inferring means (not shown), and the power source/package/measurement system RLC information are used as input information (step 2501). A current level (noise level) for each frequency is selected from the FFT result (step 2502). A frequency response of a measuring apparatus in the case where a current having the amplitude of a current value of the frequency is given to an RLC circuit of a power source/package/measurement system is calculated (step 2503), and an operation of accumulating response results is performed (step 2504). It is judged whether the process on all the frequencies is ended or not (step 2505). If it is judged that the process is ended, a frequency spectrum which is a result of the accumulation of the frequency responses, and in which the power source, the package, and the measurement system are considered is output as output information (step 2506).

According to this configuration, an influence of the power source net on an FFT result can be correctly expressed. Since response results for respective frequencies are accumulated, the influence can be expressed more accurately.

Embodiment 8

The embodiment is characterized in an analyzing and processing method.

Namely, power source waveform results are stored in the form of a library, and FFT characteristics of the whole circuit is calculated.

The apparatus is characterized in that a current analysis of a cell or a block in which input and output conditions, the frequency, the interconnect capacitance, the slew rate, and the like are used as parameters is previously performed, and an FFT library storing a result of the analysis is provided.

Figure 28:
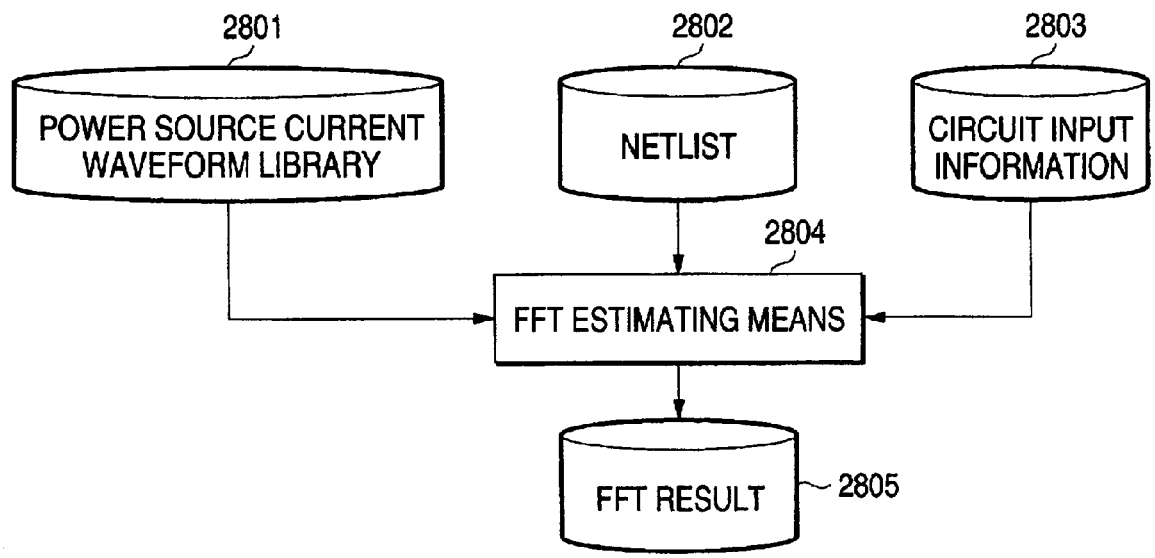
FIG. 28 is a block diagram showing a configuration for realizing a method of analyzing electromagnetic interference in an eighth embodiment of the invention.

FIG. 28 shows the configuration of an apparatus which is used in a method of analyzing electromagnetic interference according to an embodiment of the invention. The apparatus for analyzing electromagnetic interference shown in the figure has: a current waveform library 2801 storing results of current analyses of cells or blocks in which input and output conditions, the frequency, the interconnect capacitance, the slew rate, and the like are used as parameters; a netlist 2802; circuit input information 2803; and current FFT inferring means 2804, and outputs an FFT result 2805.

Figure 29:
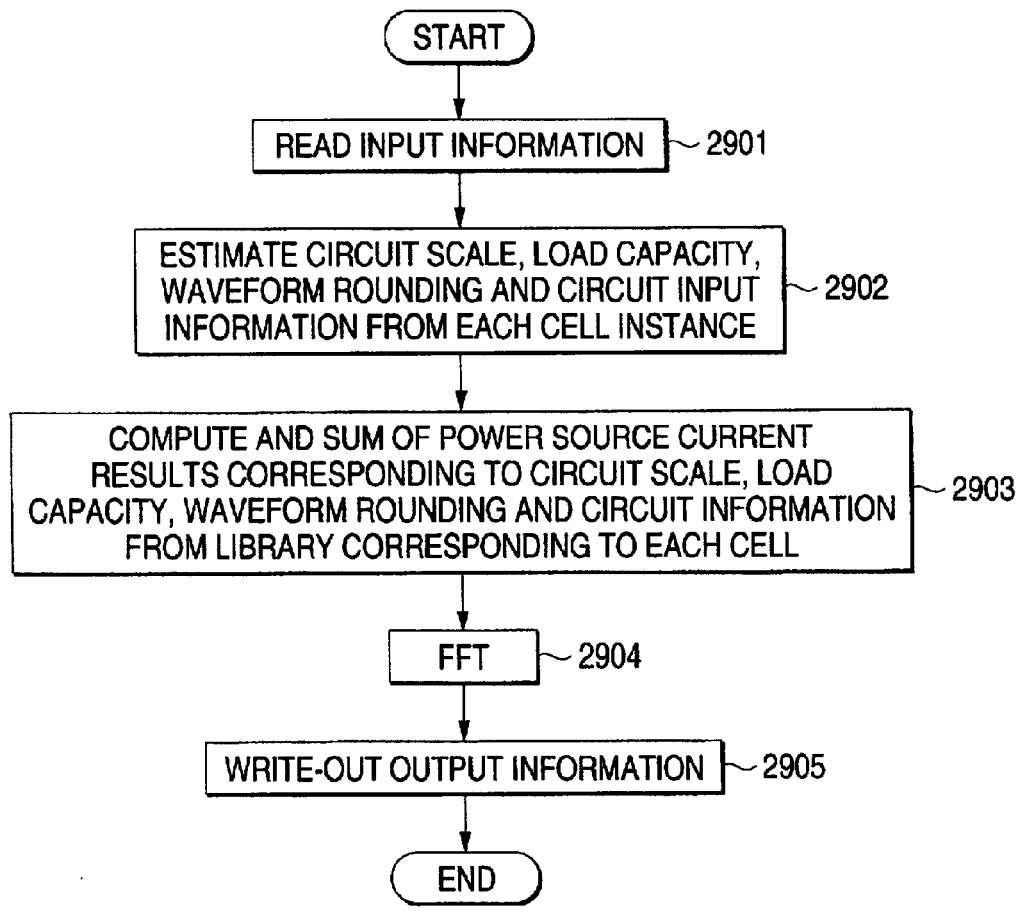
FIG. 29 is a flowchart showing an inferring method in FFT inferring means in the eighth embodiment of the invention.

The current FFT inferring means 2804 implements an analysis in accordance with a flowchart of FIG. 29.

First, in step 2901, netlist information stored in the netlist 2802, and the circuit input information 2803 are read.

Then, the circuit scale, the load capacitance, the waveform rounding, and the circuit input information are inferred in step 2902 from a library corresponding to each cell.

In step 2903, from the library corresponding to each cell, a current waveform corresponding to the circuit scale, the load capacitance, the waveform rounding, and the circuit input information is read out. The obtained current waveforms for the cells are summed up to calculate a power source current result.

Thereafter, FFT is performed in step 2904, and output information is written out in step 2905.

According to the embodiment, namely, in a calculation of an FFT analysis result of a whole LSI, FFT analysis results of all elements are not calculated, but current waveforms obtained from the FFT library are summed up, so that an FFT result can be obtained while the computational complexity is remarkably reduced.

According to the method described above, corresponding power source current waveforms are taken out from the library, and FFT inference is then performed. Therefore, a current calculation and FFT can be omitted, and the speed can be increased.

When the method is combined with the first to seventh embodiments, an FFT result can be obtained more rapidly by using a smaller memory capacity, and influence of noise in the whole of an LSI can be estimated at a high speed.

Embodiment 9

In the embodiment, FFT results are stored in a library, and FFT characteristics of the whole of a circuit are calculated.

The embodiment is characterized in that a current analysis of a cell or a block in which input and output conditions, the frequency, the interconnect capacitance, the slew rate, and the like are used as parameters is previously performed, and an FFT library storing a result of the analysis is provided.

Figure 30:
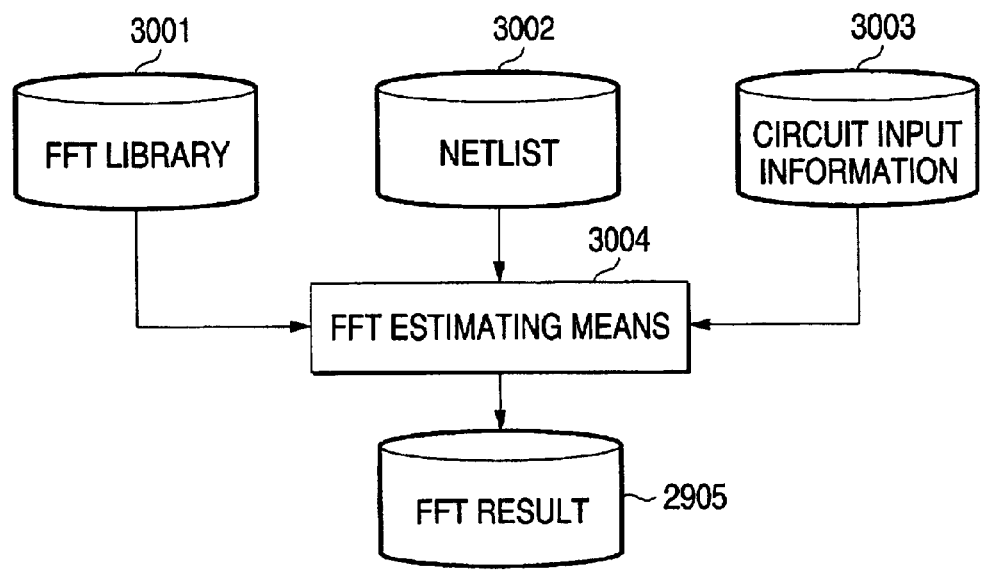
FIG. 30 is a block diagram showing a configuration for realizing a method of analyzing electromagnetic interference in a ninth embodiment of the invention.

FIG. 30 shows the configuration of an apparatus which is used in a method of analyzing electromagnetic interference according to an embodiment of the invention. The apparatus for analyzing electromagnetic interference shown in the figure has: an FFT library 3001 storing results of current analyses of cells or blocks in which input and output conditions, the frequency, the interconnect capacitance, the slew rate, and the like are used as parameters; a netlist 3002; circuit input information 3003; and current FFT inferring means 3004, and outputs an FFT result 3005.

Figure 31:
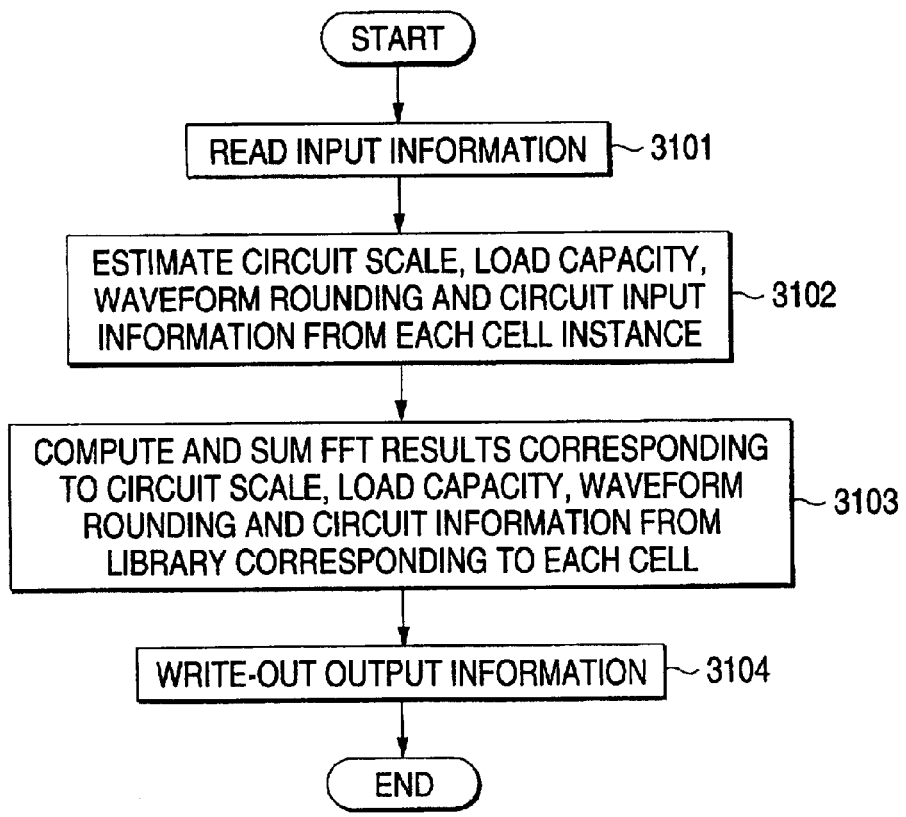
FIG. 31 is a flowchart showing an inferring method in FFT inferring means in a ninth embodiment of the invention.

The current FFT inferring means 3004 implements an analysis in accordance with a flowchart of FIG. 31.

First, in step 3101, netlist information stored in the netlist 3102, and the circuit input information 3103 are read.

Then, the circuit scale, the load capacitance, the waveform rounding, and the circuit input information are inferred in step 3102 from a library corresponding to each cell.

In step 3103, from a library corresponding to each cell, FFT results corresponding to the circuit scale, the load capacitance, the waveform rounding, and the circuit input information are calculated and accumulated.

Thereafter, output information is written out in step 3104.

According to the embodiment, namely, in a calculation of an FFT analysis result of a whole LSI, FFT analysis results of all elements are not calculated, but current components of respective frequencies obtained from the FFT library are summed up, so that an FFT result can be obtained while the computational complexity is remarkably reduced.

According to the method described above, current information is taken out from the library, and FFT inference is then performed. Therefore, a current calculation and FFT can be omitted, and the speed can be increased.

When the method is combined with the first to seventh embodiments, an FFT result can be obtained more rapidly by using a smaller memory capacity, and influence of noise in the whole of an LSI can be estimated at a high speed.

In this method, results of FFT analyses of a cell or a block in which input and output conditions, the frequency, the interconnect capacitance, the slew rate, and the like are used as parameters are previously stored in the form of a library. Alternatively, FFT data may be prepared by a static analysis or a dynamic analysis (Japanese patent applications Nos. 11-196190 and 11-200847).

Alternatively, the FFT results may be restricted to those within a range to be inferred, so that the data amount can be reduced.

Embodiment 10

The embodiment relates to a method of analysis at the functional level.

Namely, the embodiment is characterized in that results of FFT analyses of a clock buffer, a memory, an FF, and an IO in which input and output conditions, the frequency, the interconnect capacitance, the slew rate, the configuration, and the like are used as parameters are previously stored in the form of a library, only major components are provisionally subjected to logical synthesis from function description, and FFT results are inferred.

Figure 32:
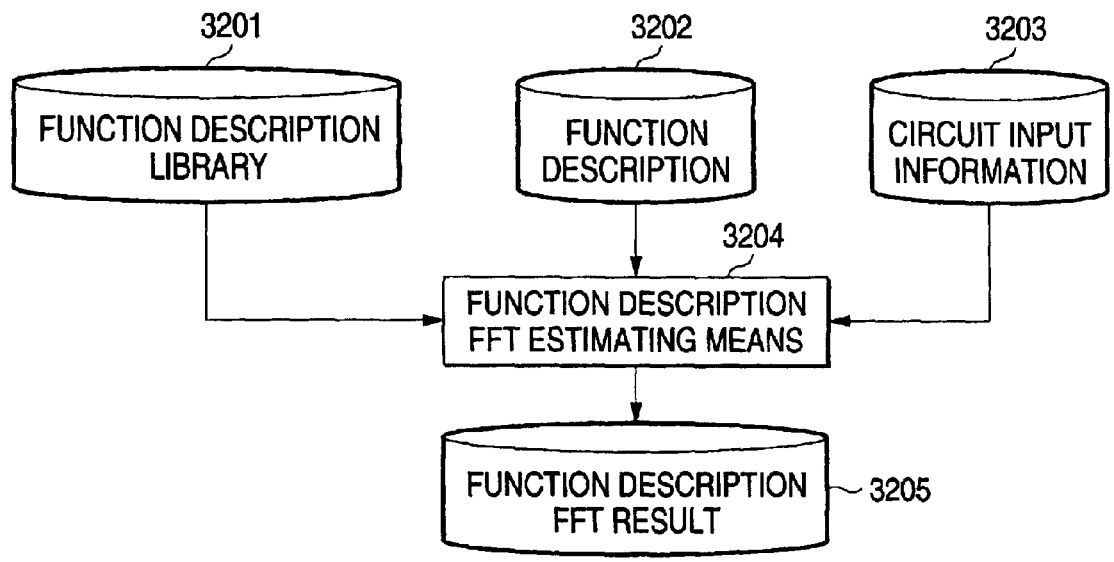
FIG. 32 is a block diagram showing a configuration for realizing a method of analyzing electromagnetic interference in a tenth embodiment of the invention.

FIG. 32 shows the configuration of an apparatus which is used in the method of analyzing electromagnetic interference. The apparatus for analyzing electromagnetic interference shown in the figure has: a function description library 3201 storing results of FFT analyses of a clock buffer, a memory, an FF, and an 10, and in which input and output conditions, the frequency, the interconnect capacitance, the slew rate, the configuration, and the like are used as parameters; a function description section comprising function description 3202; circuit input information 3203; and function description FFT inferring means 3204, and outputs a function description FFT result 3205.

Figure 33:
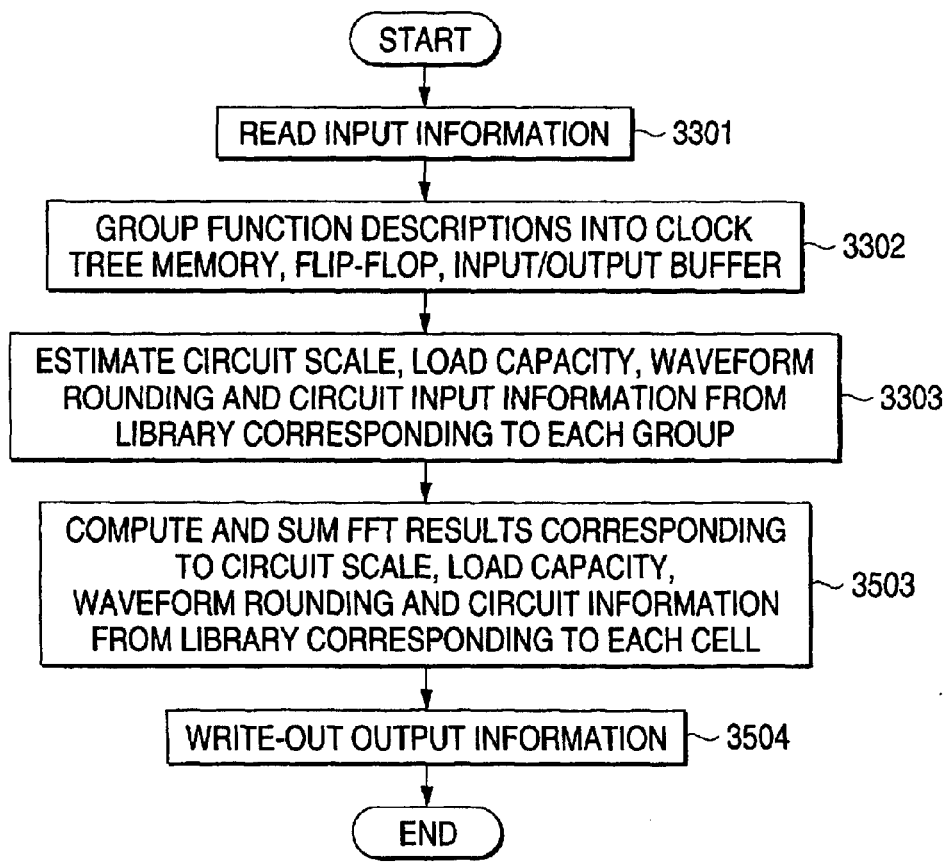
FIG. 33 is a flowchart showing an inferring method in FFT inferring means in the tenth embodiment of the invention.

The function description FFT inferring means 3204 implements an analysis in accordance with a flowchart of FIG. 33.

First, in step 3301, the function description 3202 stored in the function description section, and the circuit input information 3203 are read.

Figure 34:
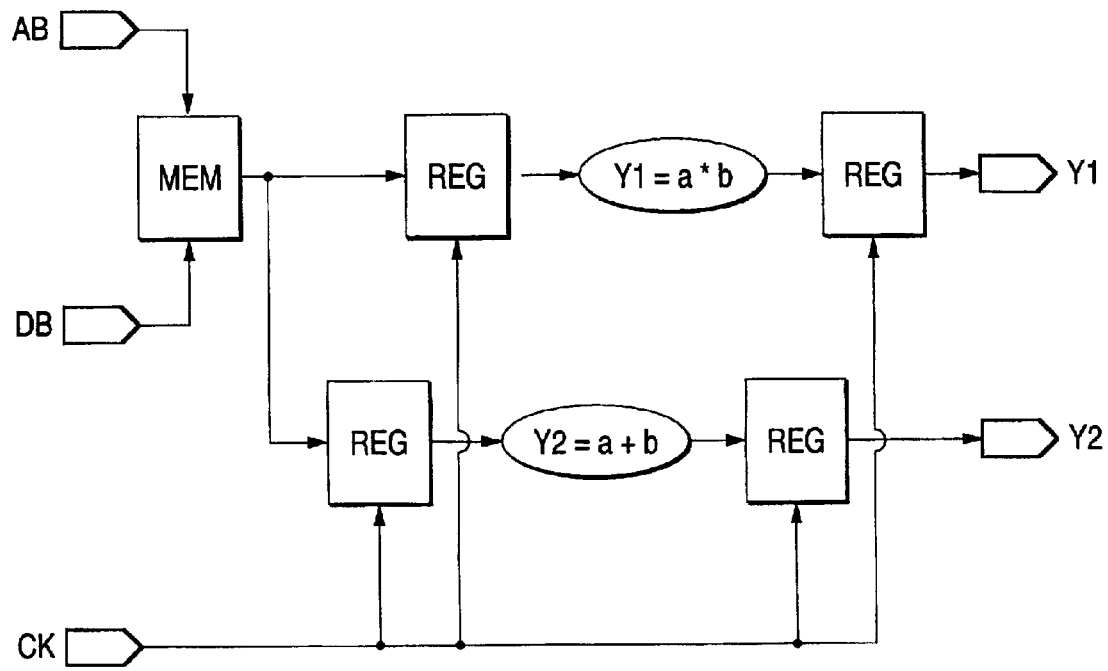
FIG. 34 is a view showing an example of function description in the tenth embodiment of the invention.

From the function description, then, components are divided in step 3302 into functional groups such as a clock tree memory, a flip-flop, and an input/output buffer shown in FIG. 34.

In step 3303, the circuit scale, the load capacitance, the waveform rounding, and the circuit input information are inferred from a library corresponding to each group.

In step 3304, from a library corresponding to each group, FFT results corresponding to the circuit scale, the load capacitance, the waveform rounding, and the circuit input information are calculated and accumulated.

Thereafter, output information is written out in step 3305.

According to the embodiment, namely, in a calculation of an FFT analysis result of a whole LSI, FFT analysis results of all elements are not calculated, but components are divided into groups at the function level and inference is then performed, whereby influence of noise in the whole of an LSI can be estimated at a high speed.

Embodiment 11

The embodiment relates to a hybrid analyzing method which uses advantages of both a dynamic analysis and a static analysis.

Namely, an inferring method is previously selected so that optimum FFT result inference is performed.

Figure 35:
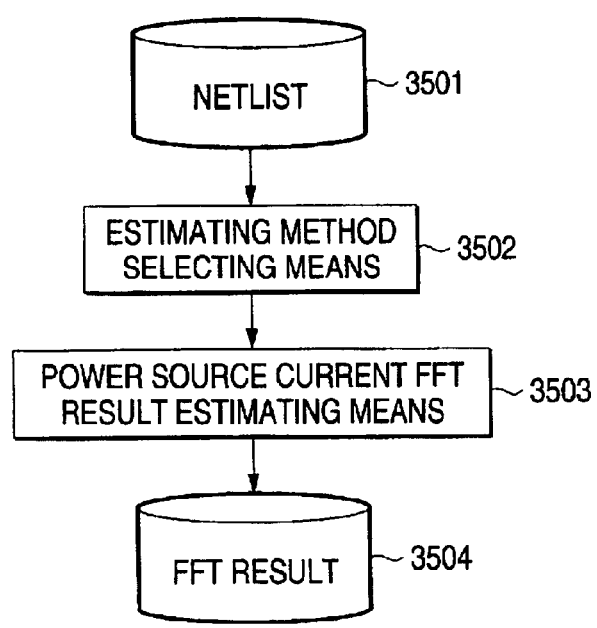
FIG. 35 is a block diagram showing an inferring method using hybrid analysis in an eleventh embodiment of the invention.

FIG. 35 shows the configuration of an apparatus which is used in the method of analyzing electromagnetic interference. The apparatus for analyzing electromagnetic interference shown in the figure has: inferring method selecting means 3502 for selecting inferring methods from a netlist 3501 in accordance with input and output conditions, the frequency, the interconnect capacitance, the slew rate, the configuration, a required accuracy, and the like; and power source current FFT result inferring means 3503 for inferring an FFT result with combining the selected inferring methods, and outputs an FFT result 3504.

Figure 36:
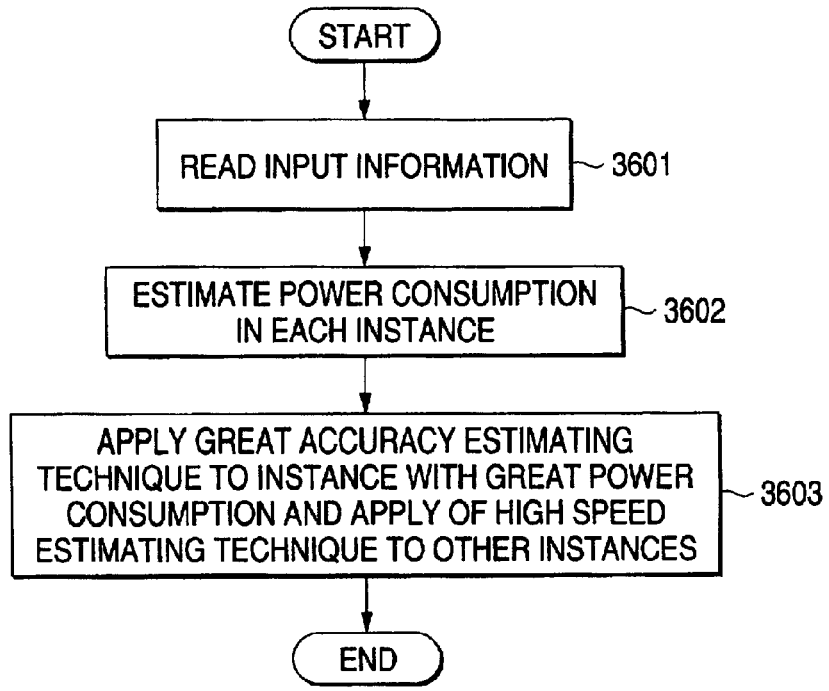
FIG. 36 is a flowchart showing the inferring method using the hybrid analysis in the eleventh embodiment of the invention.

The inferring method selecting means 3502 implements an analysis in accordance with a flowchart of FIG. 36.

First, in step 3601, input information is read.

Then, a power consumption in each instance is inferred in step 3602.

In step 3603, inferring methods are selected so that an accurate inferring method is used in an instance of high power consumption, and a high-speed inferring method is applied to the other instances.

In this way, high-speed processing can be performed.

Embodiment 12

Figure 37:
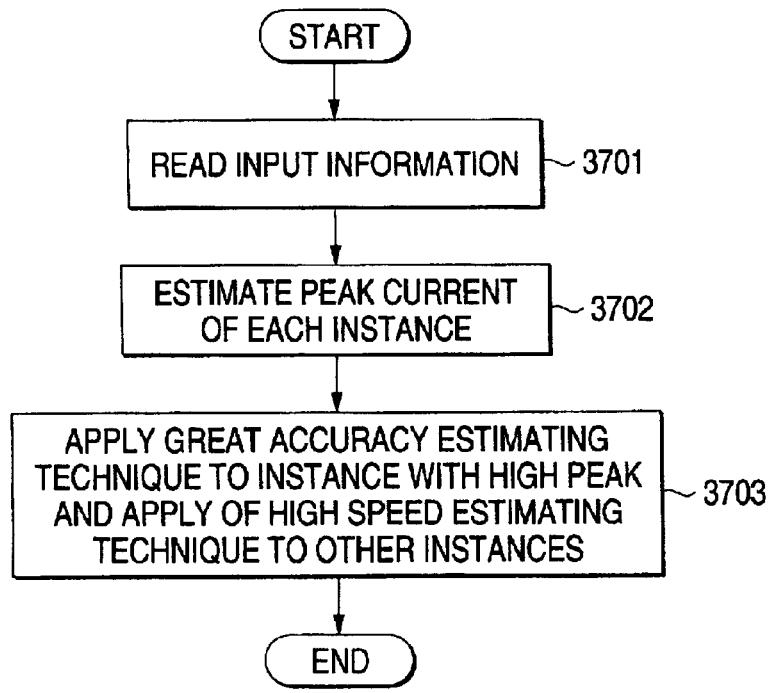
FIG. 37 is a flowchart showing an inferring method using hybrid analysis in a twelfth embodiment of the invention.

An approximate analysis is performed in an initial step, and a portion of a large peak is then analyzed in detail by using a dynamic analysis, so that influence of noise in the whole of an LSI can be estimated at a high speed (FIG. 37).

The inferring method selecting means 3502 implements an analysis in accordance with a flowchart of FIG. 37.

First, in step 3701, input information is read.

Then, a peak current in each instance is inferred in step 3702.

In step 3703, inferring methods are selected so that an accurate inferring method is used in an instance of a high peak, and a high-speed inferring method is applied to the other instances.

In this way, high-speed processing can be performed.

Embodiment 13

Figure 38:
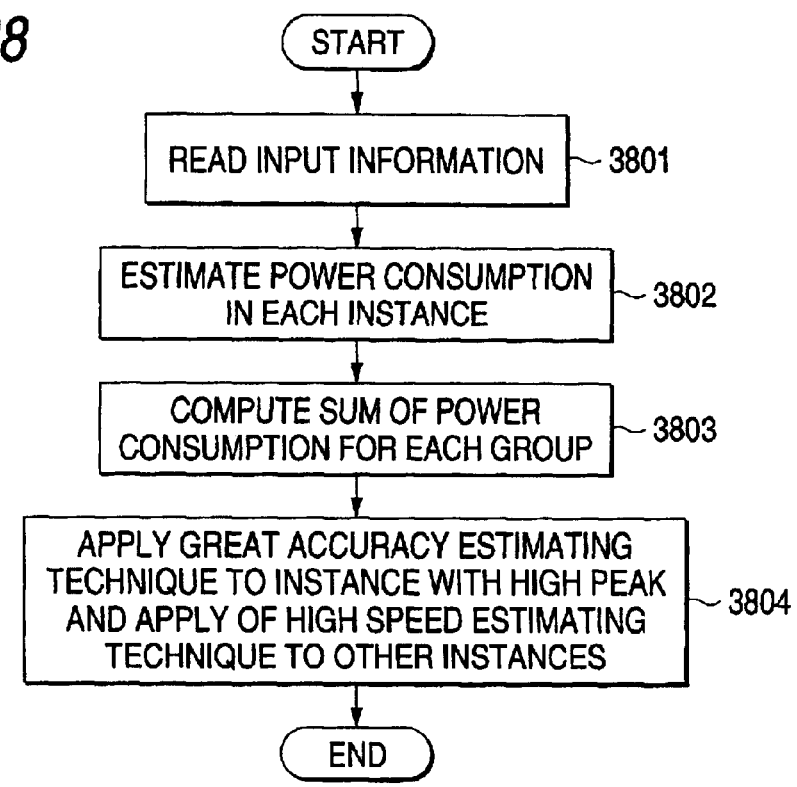
FIG. 38 is a flowchart showing an inferring method using hybrid analysis in a thirteenth embodiment of the invention.

In an initial step, a method may be employed in which an analyzing method is selected for each block in accordance with the power consumption and FF/CLK concentration (FIG. 38).

The inferring method selecting means 3502 implements an analysis in accordance with a flowchart of FIG. 38.

First, in step 3801, input information is read.

Then, a power consumption in each instance is inferred in step 3802.

In step 3803, a total sum of power consumptions is calculated for each block group, and, in step 3804, inferring methods are selected so that an accurate inferring method is used in a group of a high peak, and a high-speed inferring method is applied to the other groups.

In this way, high-speed processing can be performed.

Embodiment 14

Figure 39:
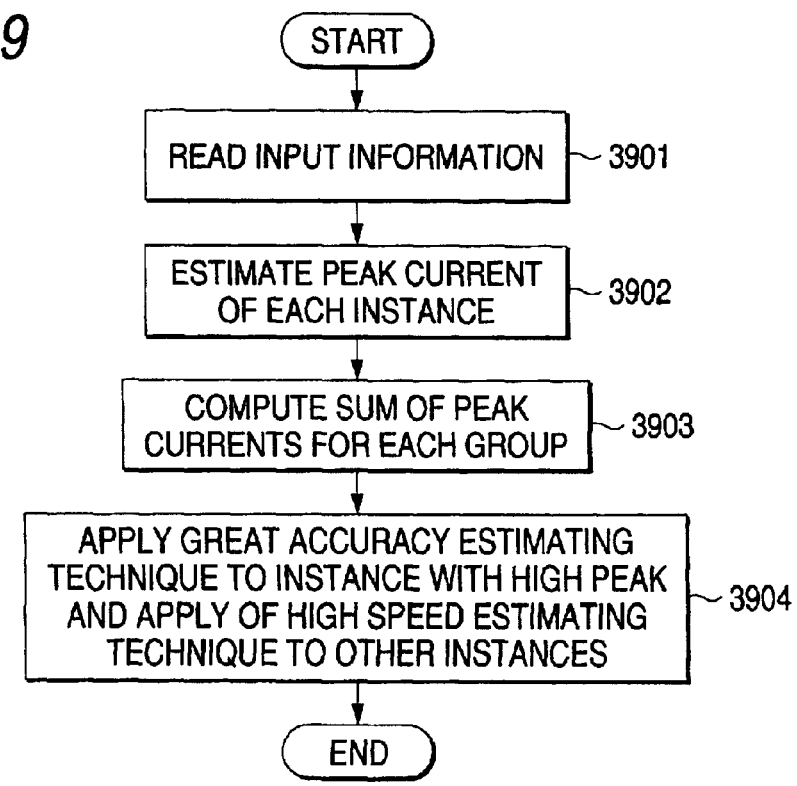
FIG. 39 is a flowchart showing an inferring method using hybrid analysis in a fourteenth embodiment of the invention.

A total sum of peak currents may be calculated for each group, and inferring methods may be selected so that an accurate inferring method is used in a group of a high peak, and a high-speed inferring method is applied to the other groups (FIG. 39).

The inferring method selecting means 3502 implements an analysis in accordance with a flowchart of FIG. 39.

First, in step 3901, input information is read.

Then, a peak current in each instance is inferred in step 3902.

In step 3903, a total sum of peak currents is calculated for each group, and, in step 3904, inferring methods are selected so that an accurate inferring method is used in a group of a high peak, and a high-speed inferring method is applied to the other groups.

In this way, high-speed processing can be performed.
Embodiment 15

The number of flip-flops and clock buffers may be calculated for each group, and inferring methods may be selected so that an accurate inferring method is used in a group in which the number is large, and a high-speed inferring method is applied to the other groups.

Figure 40:
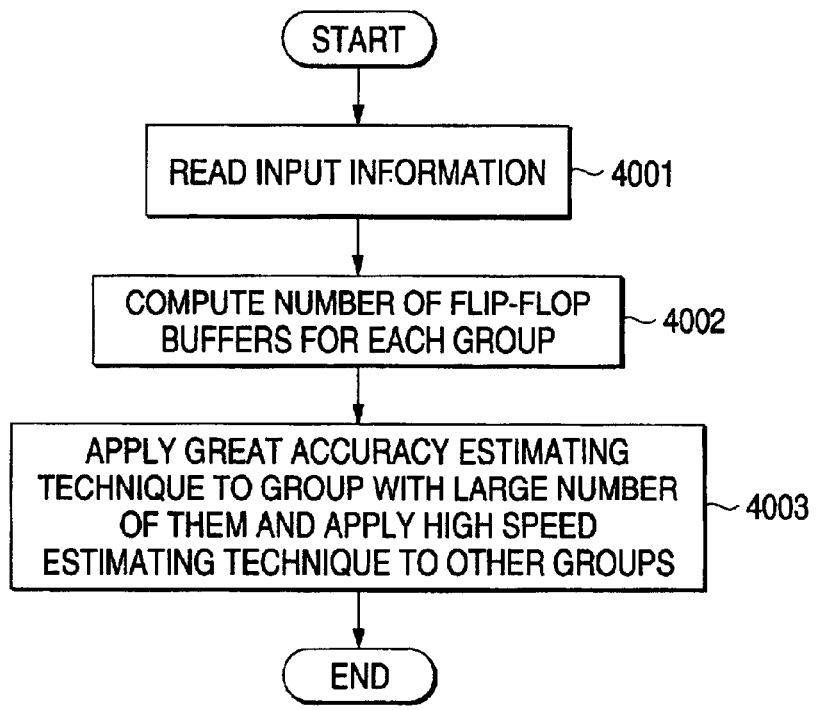
FIG. 40 is a flowchart showing an inferring method using hybrid analysis in a fifteenth embodiment of the invention.

The inferring method selecting means 3502 implements an analysis in accordance with a flowchart of FIG. 40.

First, in step 4001, input information is read.

In step 4002, the number of flip-flops and clock buffers is calculated for each group, and a power consumption in each instance is inferred.

In step 4003, inferring methods are selected so that an accurate inferring method is used in a group in which the number is large, and a high-speed inferring method is applied to the other groups.

In this way, high-speed processing can be performed.
Embodiment 16

The embodiment also relates to a hybrid analyzing method which uses advantages of both a dynamic analysis and a static analysis.

Namely, judgement is made according to the analysis accuracy, whereby an inferring method is previously selected so that optimum FFT result inference is performed.

Figure 41:
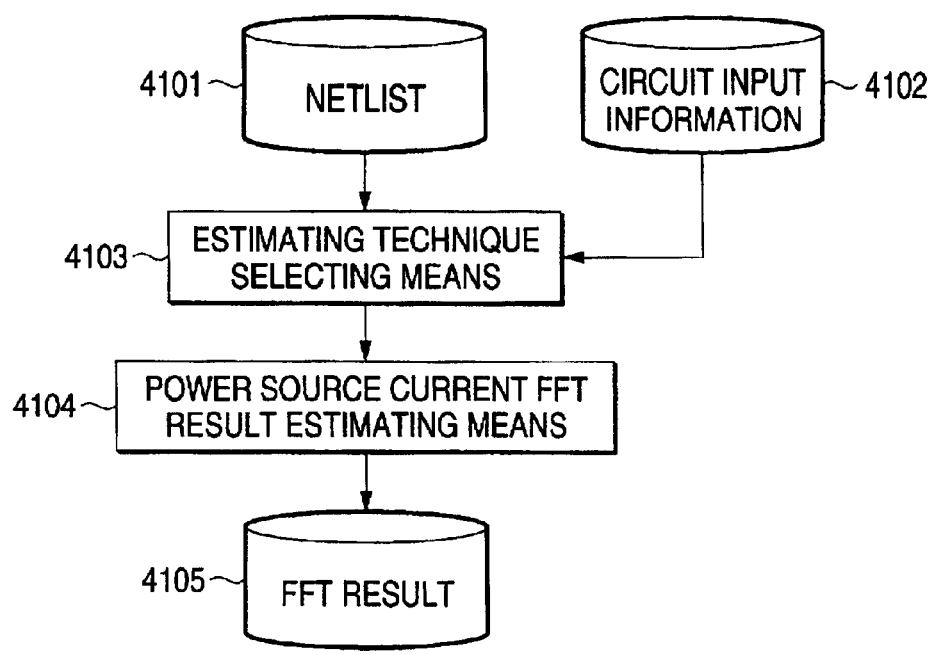
FIG. 41 is a block diagram of an apparatus for implementing an inferring method using hybrid analysis in a sixteenth embodiment of the invention.

FIG. 41 shows the configuration of an apparatus which is used in the method of analyzing electromagnetic interference. The apparatus for analyzing electromagnetic interference shown in the figure has: inferring method selecting means 4103 for selecting an inferring method from a netlist 4101 and circuit input information 4102 in accordance with input and output conditions, the frequency, the interconnect capacitance, the slew rate, the configuration, a required accuracy, and the like; and power source current FFT result inferring means 4104 for inferring an FFT result with combining the selected inferring methods, and outputs an FFT result 4105.

Figure 42:
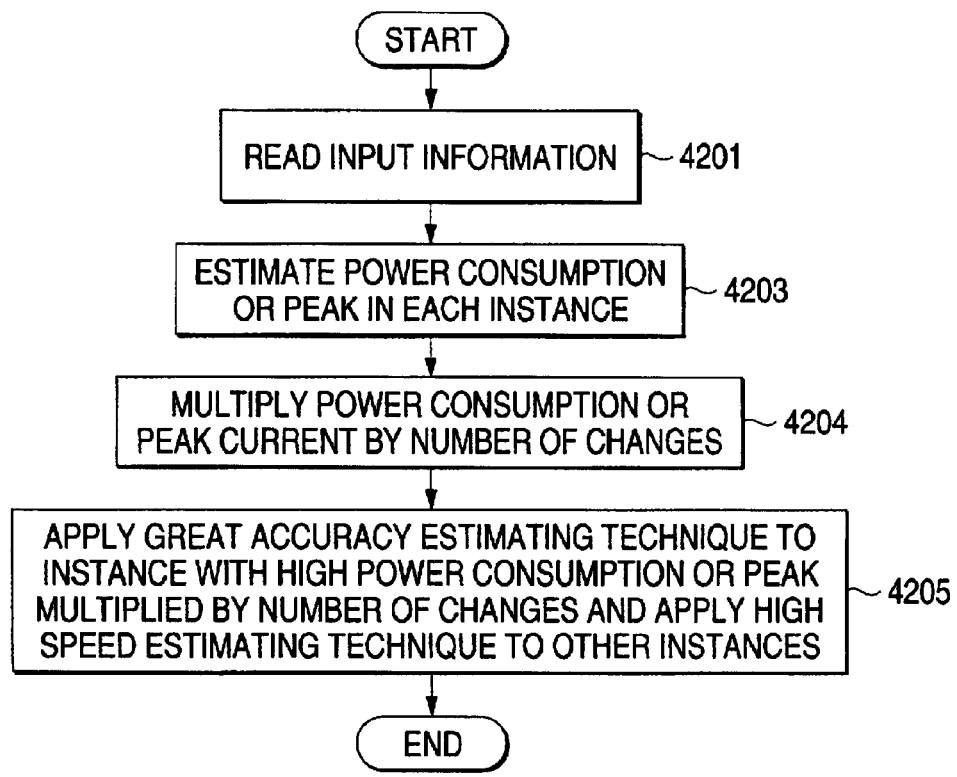
FIG. 42 is a flowchart showing the inferring method using the hybrid analysis in the sixteenth embodiment of the invention.

The inferring method selecting means 4102 implements an analysis in accordance with a flowchart of FIG. 42.

First, in step 4201, input information is read.

In step 4202, a power consumption or a peak current in each instance is inferred.

In step 4203, the number of changes in each instance is inferred.

In step 4204, the power consumption or the peak currents is multiplied with the change number, and inferring methods are selected so that an accurate inferring method is used in an instance in which the product is large, and a high-speed inferring method is applied to the other instances.

In this way, high-speed processing can be performed.
Embodiment 17

A frequency spectrum may be calculated by a high-speed inferring method, and the high-speed inferring method may be reapplied to a portion of a high peak.

Figure 43:
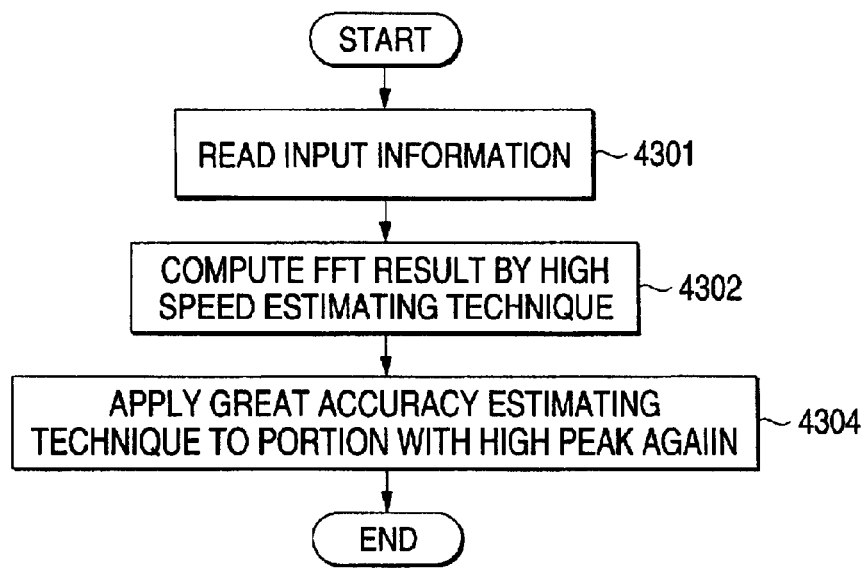
FIG. 43 is a flowchart showing an inferring method using hybrid analysis in a seventeenth embodiment of the invention.

As shown in a flowchart of FIG. 43, the inferring method selecting means 4102 implements an analysis.

First, in step 4301, input information is read.

In step 4302, a frequency spectrum (FFT result) is calculated by a high-speed inferring method.

In step 4303, the high-speed inferring method is reapplied to a portion of a high peak, and an inferring method is selected.

In this way, high-speed processing can be performed.
Embodiment 18

Next, a method of analyzing electromagnetic interference which uses an incremental calculation will be described.

There is a problem in that correction requires recalculation and therefore takes a very long time period. The embodiment solves the problem, and is characterized in that calculation is performed only on a difference so as to enhance the speed.

Figure 44:
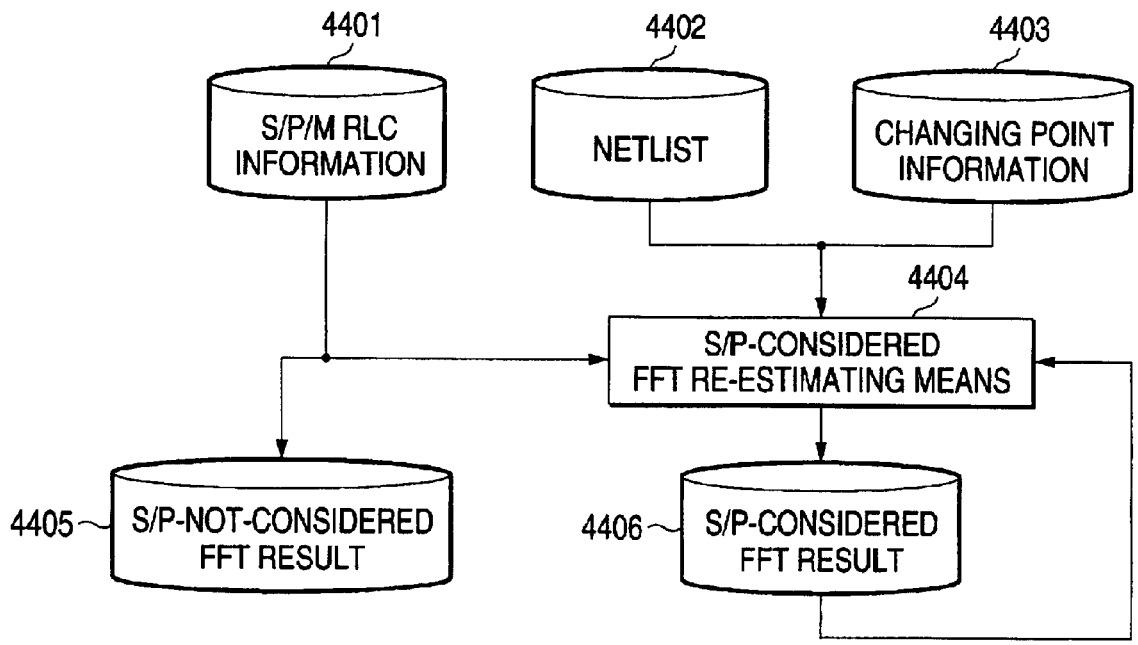
FIG. 44 is a block diagram of an apparatus for implementing an inferring method using incremental analysis in an eighteenth embodiment of the invention.

FIG. 44 shows the configuration of an apparatus which is used in the method of analyzing electromagnetic interference. The apparatus for analyzing electromagnetic interference shown in the figure is configured so that power source/package considered FFT reinferring means 4404 infers an FFT result by using power source/package/measurement system RLC information 4401, a frequency spectrum 4405 obtained by power source/package non-considered FFT, a netlist 4402 in accordance with input and output conditions, the frequency, the interconnect capacitance, the slew rate, the configuration, a required accuracy, and the like, and change information 4403 showing a change, and outputs an FFT result 4406.

Figure 45:
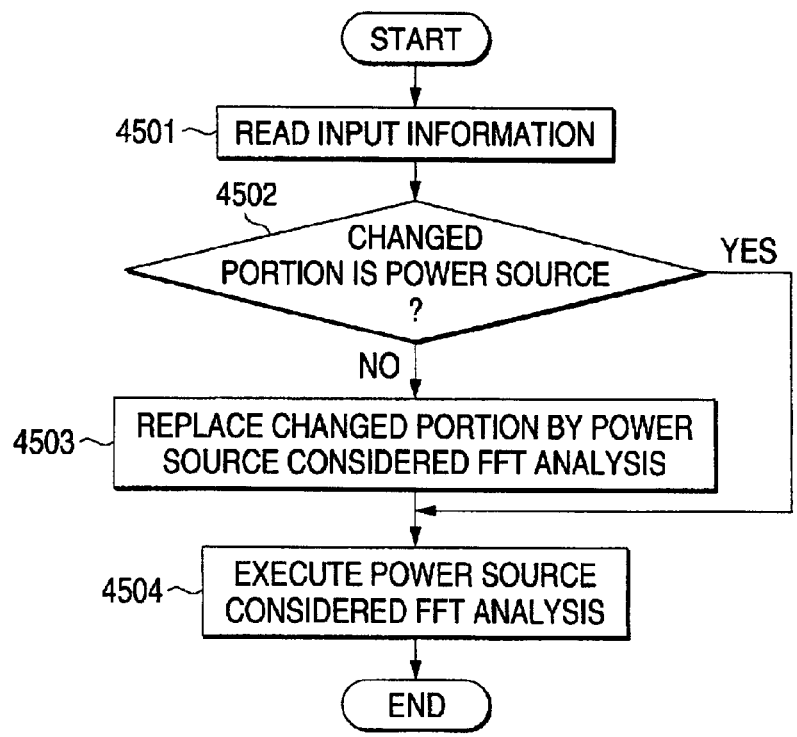
FIG. 45 is a flowchart showing the inferring method using the incremental analysis in the eighteenth embodiment of the invention.
Figure 46:
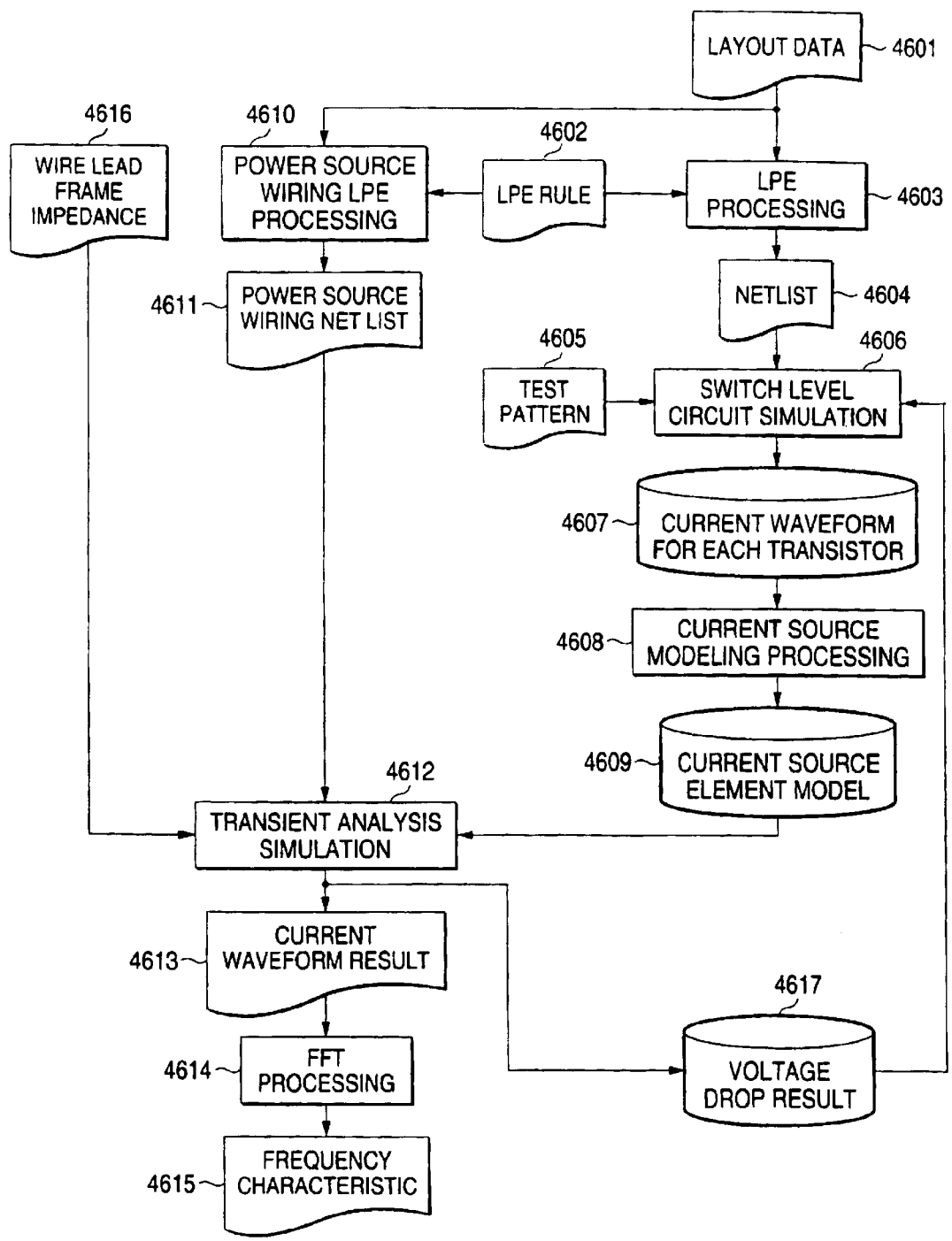
FIG. 46 is a block diagram showing a conceptual configuration for realizing a method of analyzing electromagnetic interference in a conventional art example.
Figure 47:
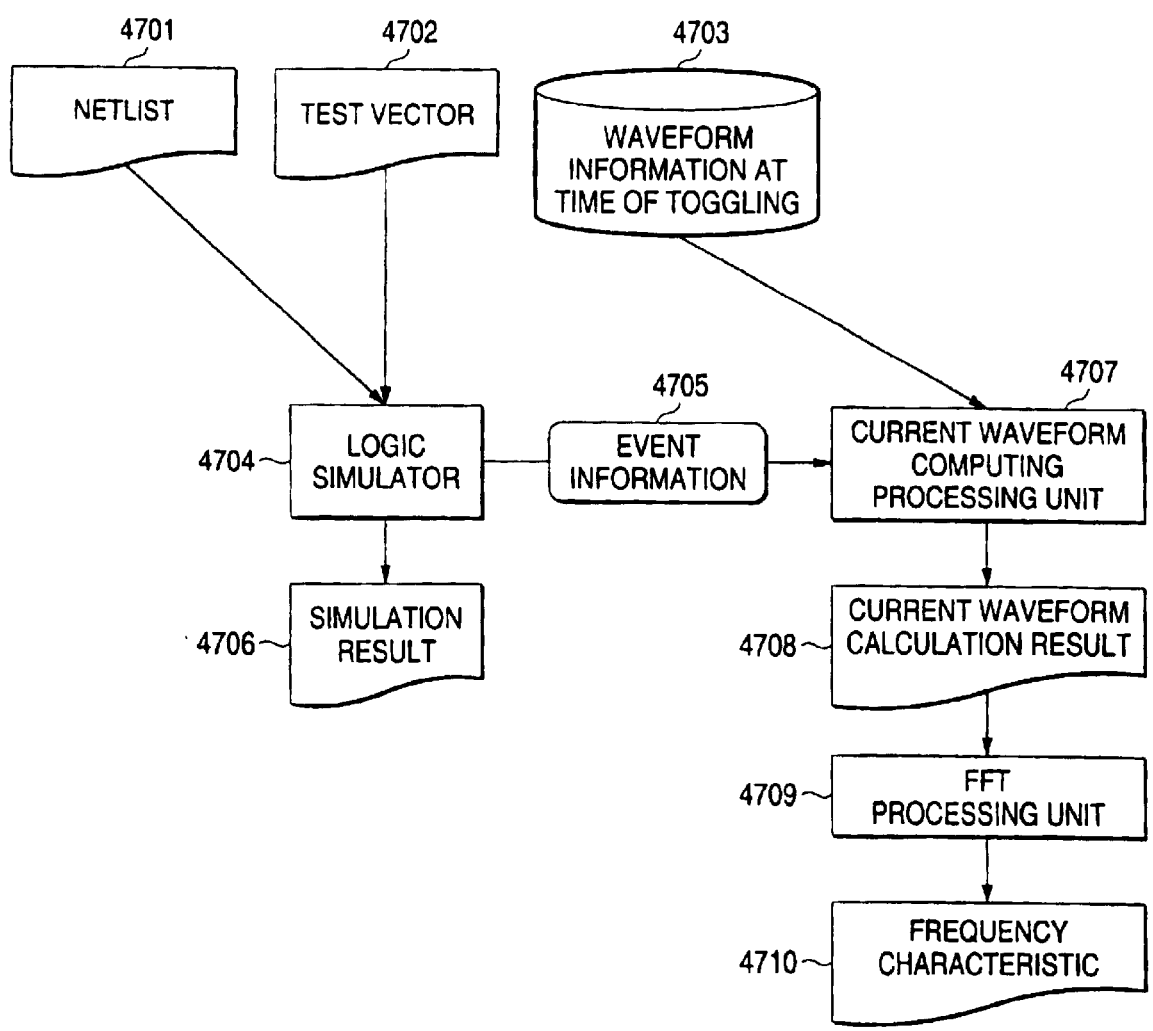
FIG. 47 is a block diagram showing a conceptual configuration for realizing a method of analyzing electromagnetic interference at the transistor level in a conventional art example.

Reinferring method selecting means 4404 implements an analysis in accordance with a flowchart of FIG. 45.

First, in step 4501, input information is read.

Next, it is judged in step 4502 whether the change is in the power source or not. If the change is in the power source, power source considered FFT analysis is implemented (step 4504).

If the change is not in the power source, only the change place is replaced by means of power source non-considered FFT analysis (step 4503), and power source considered FFT analysis is then implemented (step 4504).

In this way, high-speed processing can be performed.

The invention is characterized in that, in analysis of a power source current which would be the principal factor of electromagnetic interference, the method includes: a step of calculating information of an equivalent power source current flowing in a power source current in an ideal power source, from circuit information of the LSI chip; an estimating step of considering at least one of power source information of a power source for supplying a current to the LSI chip, package information of a package for the semiconductor chip, and measurement system information of a measurement system for measuring characteristics of the semiconductor chip, as analysis control information, and of estimating total information in which the analysis control information is reflected in the circuit information, as an equivalent circuit; and a simulation step of performing a simulation in accordance with the total information which is estimated in the estimating step.

According to the configuration, electromagnetic interference due to the power source/package/measurement system is analyzed rapidly and accurately by using a small memory capacity.

An influence of decoupling due to the resistance, the capacitance, and the inductance of the power source and the ground, and hybrid analysis are reflected in a power source current calculation, whereby rapidity and high accuracy can be made compatible and electromagnetic interference of an LSI can be evaluated in a simulation within a realistic time period. Furthermore, finding of a place where EMI occurs is supported, so that also an efficient countermeasure against EMI is enabled.

What is claimed is:

1. A method of analyzing electromagnetic interference in which an amount of electromagnetic interference from an LSI is analyzed, wherein said method includes:

an equivalent power source current information calculating step of calculating information of an equivalent power source current flowing in a power source current, from circuit information of said LSI;

an estimating step of considering at least one of power source information of a power source for supplying a current to said LSI package information of a package for said LSI, and measurement system information of a measurement system for measuring characteristics of said semiconductor chip, as analysis control information, and of estimating total information in which said analysis control information is reflected in said circuit information, as an equivalent circuit; and a total information analyzing step of performing analysis in accordance with said total information which is estimated in said estimating step.

2. A method of analyzing electromagnetic interference according to claim 1, wherein said estimating step is a step of calculating a total impedance by adding said analysis control information to said circuit information, and of outputting said calculated total impedance as total information to said total information analyzing step.

3. A method of analyzing electromagnetic interference according to claim 1, wherein said analysis control information includes: said power source information of said power source for supplying a current to said LSI chip; and at least one of said package information of said package for said semiconductor chip, and said measurement system information of said measurement system for measuring characteristics of said semiconductor chip.

4. A method of analyzing electromagnetic interference according to claim 1, wherein said analysis control information includes: said power source information of said power source for supplying a current to said LSI chip; said package information of said package for said semiconductor chip; and said measurement system information of sold measurement system for measuring characteristics of said semiconductor chip.

5. A method of analyzing electromagnetic interference according to claim 1, wherein said total information analyzing step is a simulation step of performing a simulation by adding said equivalent power source current information to said total information.

6. A method of analyzing electromagnetic interference according to claim 1, wherein said total information analyzing step includes: a step of obtaining corrected equivalent power source current information in which said equivalent power source current is corrected by reflecting said total information; and a frequency spectrum calculating step of calculating, frequency spectrum of said corrected equivalent power source current information.

7. A method of analyzing electromagnetic interference according to claim 1, wherein said equivalent power source current information calculating step includes a frequency spectrum calculating step of calculating a frequency spectrum.

8. A method of analyzing electromagnetic interference according to claim 1, wherein said total information analyzing step is a step of obtaining a correction function for correcting said equivalent power source current information, from said total information, and of calculating sold equivalent power source current information using said correction function.

9. A method of analyzing electromagnetic interference according to any one of claims 1 to 8, wherein said equivalent power source current information calculating step includes:

a step of calculating an instantaneous current amount in consideration of; event information which is generated at occurrence of a change of a signal, and which includes instance names of cells of said LSI chip that is on object of the occurrence, a name of the signal, an occurrence time, and transition information and said total information which is estimated in said estimating step; and a modeling step of modeling said instantaneous current amount in accordance with a predetermined rule.

10. A method of analyzing electromagnetic interference according to claim 9, wherein said modeling step is a step of accumulating current waveforms each having a Japanese chess piece-like shape.

11. A method of analyzing electromagnetic interference according to claim 5, wherein said simulation step includes a step of synchronizing with said equivalent power source current information calculating step.

12. A method of analyzing electromagnetic interference according to claim 5, wherein said simulation step includes a step of repeatedly performing a simulation in synchronization with a timing of adding information to said equivalent power source current information.

13. A method of analyzing electromagnetic interference according to claim 5, wherein said simulation step includes a step of reading said equivalent power source current information at predetermined intervals.

14. A method of analyzing electromagnetic interference according to claim 6, wherein said frequency spectrum calculating step includes a collapsing step at collapsing said corrected equivalent power source current information at predetermined intervals.

15. A method of analyzing electromagnetic interference according to claim 14, wherein, in said collapsing step, sets of said corrected equivalent power source current information at predetermined intervals are averaged or maximized in time sequence.

16. A method of analyzing electromagnetic interference according to any one of claims 1 to 15, wherein said equivalent power source current information calculating step is a library accumulating step of calculating accumulation of library information which is equivalent power source current information of each portion of said current information that is previously calculated.

17. A method of analyzing electromagnetic interference according to claim 16, wherein said library information is a function or a table of one of input signal information and output signal information of each portion of said current information, and an output capacitance.

18. A method of analyzing electromagnetic interference according to claim 16, wherein said library information is information of a portion which is obtained by dividing said circuit information into one or more parts, i.e., a clock synchronous part which is synchronized with a clock, and a clock asynchronous part which is not synchronized with said clock.

19. A method of analyzing electromagnetic interference according to claim 18, wherein said clock synchronous part is a flip-flop, a clock buffer, or a synchronous memory.

20. A method of analyzing electromagnetic interference according to claim 16, wherein said library accumulating step includes a step of, from said circuit information, analogizing which portion of said circuit information corresponds to a library.

21. A method of analyzing electromagnetic interference according to any one of claims 1 to 15, wherein said equivalent power source current information calculating step includes a calculation method determining step of selecting one of a high speed equivalent power source current information calculating method and an accurate equivalent power source current information calculating method, based on partial circuit information of said circuit information.

22. A method of analyzing electromagnetic interference according to any one of claims 1 to 15, wherein said equivalent power source current information calculating step includes a differential power source current calculating step of, based on a difference of said circuit information with respect to equivalent power source current information which has been already analyzed, calculating power source current information of said difference only.

23. A method of analyzing electromagnetic interference according to any one of claims 1 to 15, wherein said method further includes an analysis information displaying step of displaying a result obtained in said total information analyzing step, as analysis information.

24. A method of analyzing electromagnetic interference according to any one of claims 1 to 15, wherein said method further includes an optimizing step of optimizing said circuit information so as to reduce electromagnetic interference, based on a result obtained in said total information analyzing step.

25. A method of analyzing electromagnetic interference according to claim 24, wherein said method further includes an optimized information displaying step of displaying circuit information obtained in said optimizing step, as optimized information.

26. An apparatus for analyzing electromagnetic interference in which an amount of electromagnetic interference from an LSI is analyzed, wherein said apparatus includes:

equivalent power source current information calculating means for calculating information of an equivalent power source current flowing in a power source current, from circuit information of said LSI;

estimating means for considering at least one of power source information of a power source for supplying a current to said LSI, package information of a package for said LSI, and measurement system information of a measurement system for measuring characteristics of said semiconductor chip, as analysis control information, and for estimating total information in which said analysis control information is reflected in said circuit information, as an equivalent circuit; and total information analyzing means for peforming analysis in accordance with said total information which is estimated in said estimating means.

27. An apparatus for analyzing electromagnetic interference according to claim 26, wherein said estimating means calculates a total impedance by adding said analysis control information to said circuit information, and outputs said calculated total impedance as total information to said total information analyzing means.

28. An apparatus for analyzing electromagnetic interference according to claim 26 or 27, wherein said total information analyzing means is simulation means for performing a simulation by adding said equivalent power source current information to said total information.

* * * * *